(12) United States Patent
Maegawa

(10) Patent No.: US 6,548,859 B2
(45) Date of Patent: Apr. 15, 2003

(54) MOS SEMICONDUCTOR DEVICE AND METHOD OF MANUFACTURING THE SAME

(75) Inventor: Shigeto Maegawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/939,805

(22) Filed: Aug. 28, 2001

(65) Prior Publication Data

US 2002/0003256 A1 Jan. 10, 2002

(30) Foreign Application Priority Data

Aug. 28, 2000 (JP) ........................................ 2000-256667
Feb. 14, 2001 (JP) ........................................ 2001-036437

(51) Int. Cl.[7] ........................... H01L 29/06; H01L 29/76
(52) U.S. Cl. ........................... 257/327; 257/347; 257/20; 257/22; 257/27; 257/330; 257/333; 257/331; 257/328; 257/622; 257/420
(58) Field of Search .................. 257/327, 347, 257/20, 22, 27, 330, 333, 331, 622, 328, 420

(56) References Cited

U.S. PATENT DOCUMENTS 6,232,164 B1 * 5/2001 Tsai et al. .................... 438/217

FOREIGN PATENT DOCUMENTS

| JP | 401059958 A | * | 3/1989 |
| JP | 4-212466 | | 8/1992 |
| JP | 405082785 A | * | 4/1993 |
| JP | 7-302902 | | 11/1995 |

OTHER PUBLICATIONS

Digh Hisamoto, et al., "Impact of the Vertical SOI "Delta" Structure on Planar Device Technology", IEEE Transactions on Electron Devices, vol. 38, No. 6, Jun. 1991, pp. 1419–1424.

* cited by examiner

*Primary Examiner*—Eddie Lee
*Assistant Examiner*—Joseph Nguyen
(74) *Attorney, Agent, or Firm*—Oblon, Spivak, McClelland, Maier & Neustadt, P.C.

(57) ABSTRACT

The object of the present invention is to suppress a short channel effect on a threshold voltage. A channel region 5, a pair of source-drain regions and an isolating film 2 having a trench isolation structure are selectively formed in a main surface of a semiconductor substrate 1. An upper surface of the isolating film 2 recedes to be lower than an upper surface of the channel region 5 in a trench portion adjacent to side surfaces of the channel region 5 and to be almost on a level with the upper surface of the channel region 5 in other regions. Consequently, a part of the side surfaces of the channel region 5 as well as the upper surface thereof are covered by a gate electrode 4 with a gate insulating film 3 interposed therebetween. A channel width W of the channel region 5 is set to have a value which is equal to or smaller than a double of a maximum channel depletion layer width Xdm. Moreover, a width of the trench adjacent to the side surfaces of the channel region 5 is set to be equal to or smaller than a double of a thickness of the gate electrode 4.

14 Claims, 25 Drawing Sheets

F I G. 10
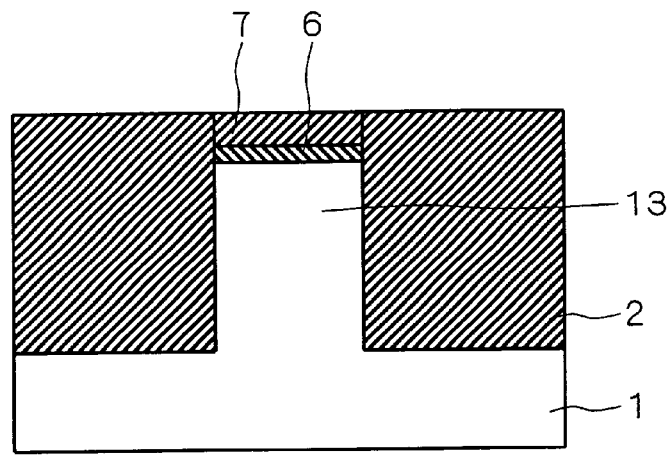
F I G. 11
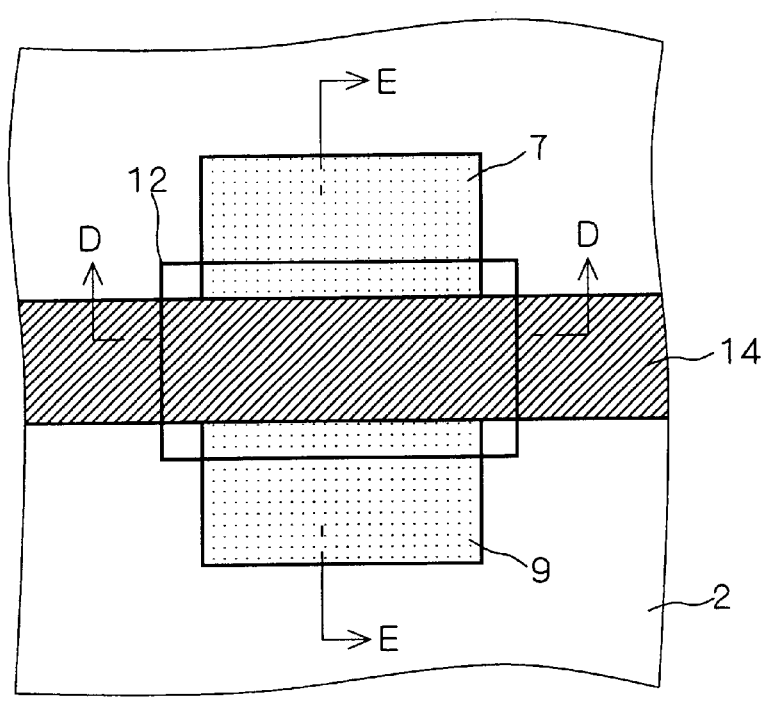

F I G. 1 2
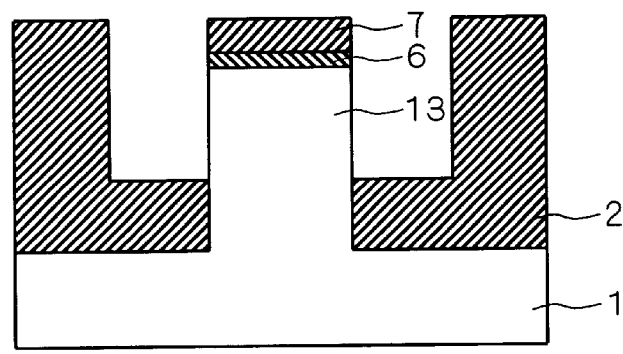
F I G. 1 3
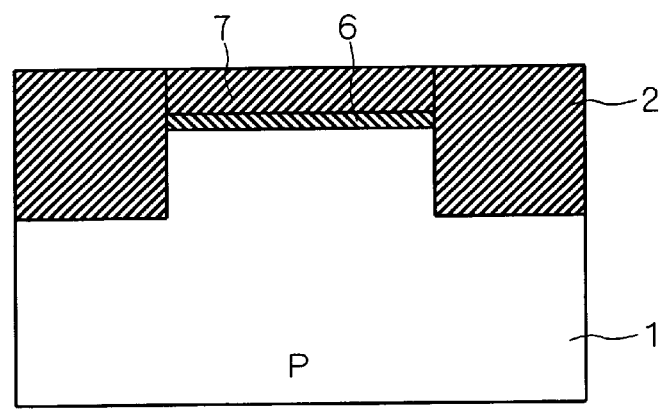
F I G. 1 4
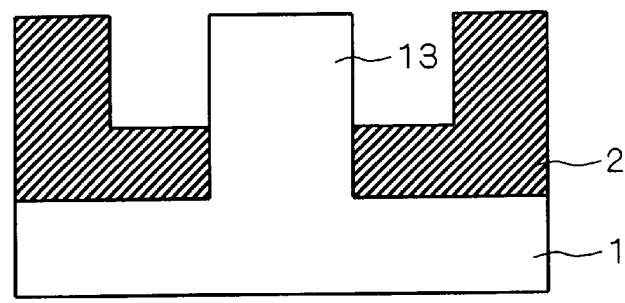

F I G. 24
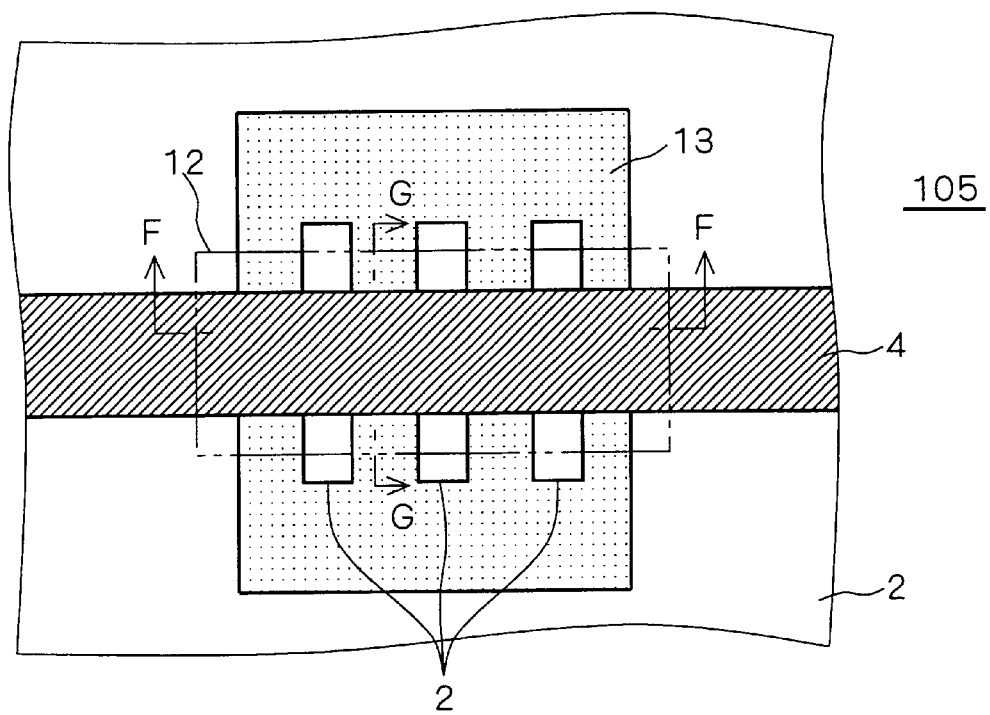
F I G. 25
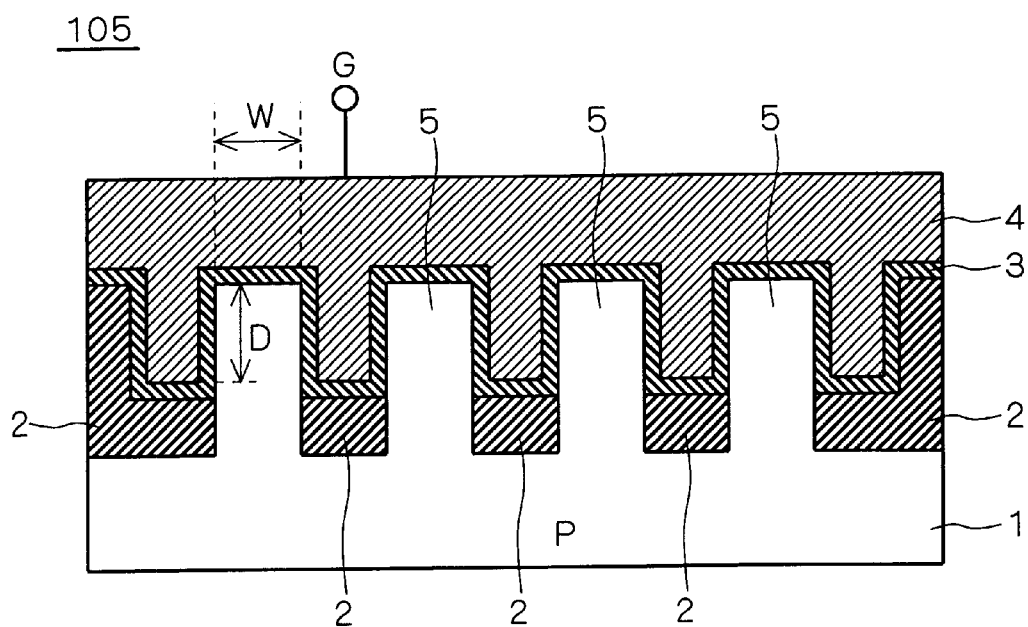

F I G. 49
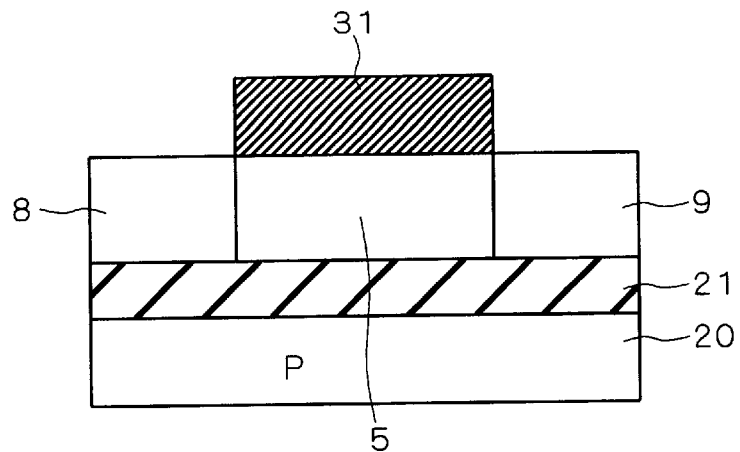
F I G. 50
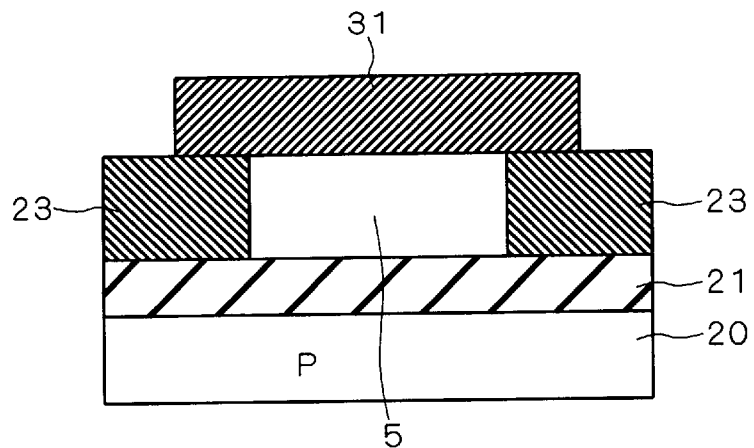
F I G. 51
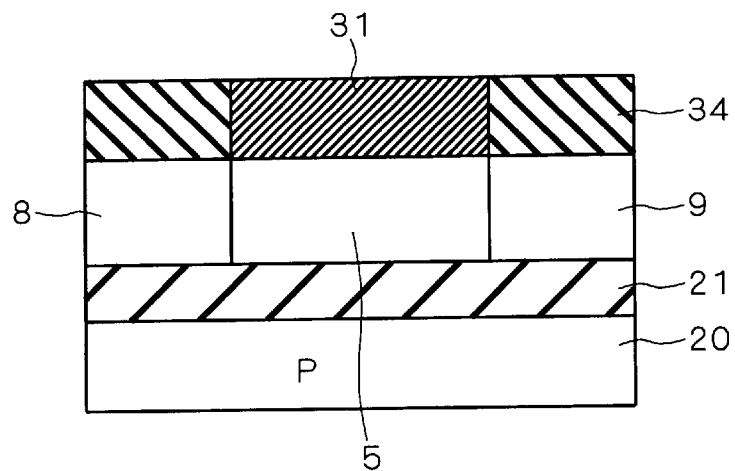

F I G. 57
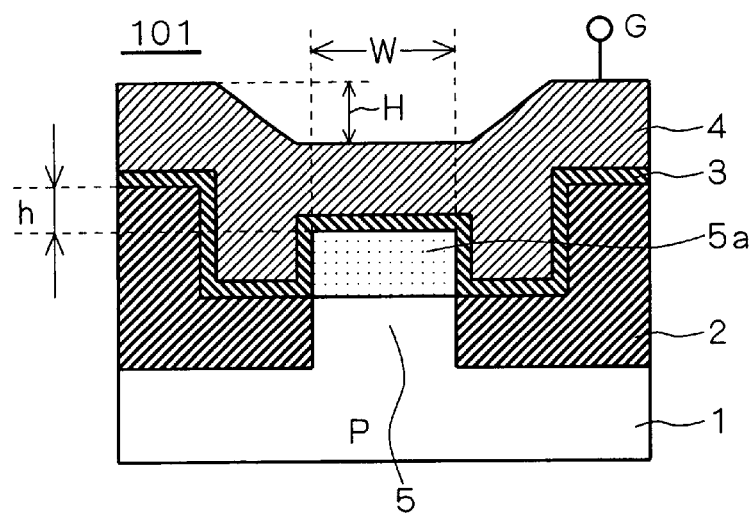
F I G. 58
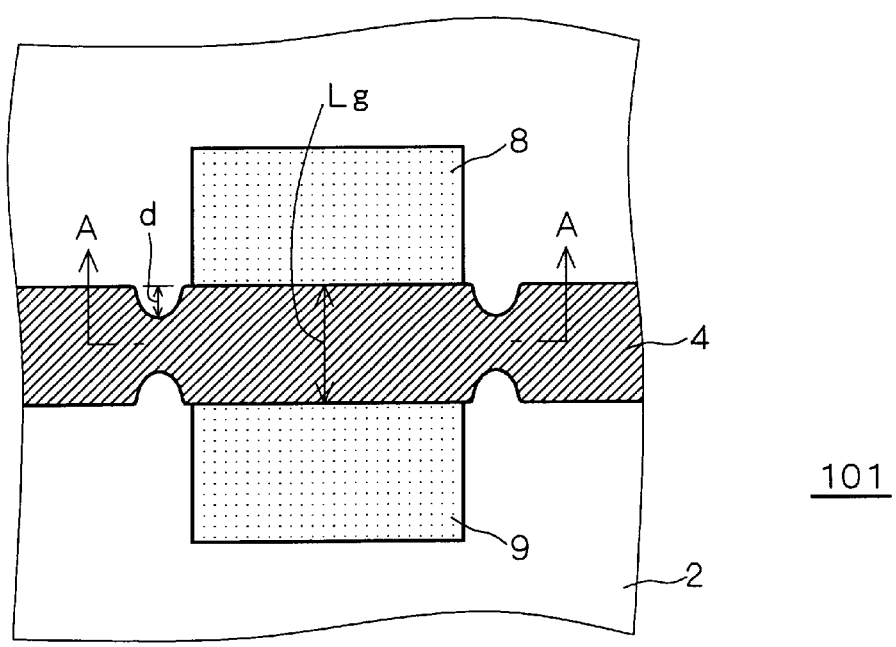

MOS SEMICONDUCTOR DEVICE AND METHOD OF MANUFACTURING THE SAME

BACKGROUND OF THE INVENTION

1. Field of the Invention

The present invention relates to a MOS semiconductor device, that is, a semiconductor device having a MOS structure and a method of manufacturing the semiconductor device, and more particularly to an improvement in suppression of a short channel effect of a threshold voltage.

2. Description of the Background Art

First of all, names to be used in this specification will be described. In this specification, a general semiconductor device comprising a structure including a channel region, a pair of source-drain regions interposing the channel region therebetween and a gate electrode opposed to the channel region with an insulating film interposed therebetween, that is, a MOS structure will be hereinafter referred to as a MOS semiconductor device. Typical examples include a MOS transistor, whereas the MOS semiconductor device is not restricted to the MOS transistor. Although a set of a source region and a drain region which interpose a channel region therebetween will be referred to as "a pair of source-drain regions" in this specification, the expression does not always imply that the source region and the drain region have shapes symmetrical with each other.

FIG. 60 is a plan view showing a conventional MOS semiconductor device. FIGS. 61 and 62 are sectional views taken along the lines K—K and L—L in FIG. 60, respectively. A device 150 is constituted as a MOS transistor in which a channel region 95, a pair of source-drain regions 98 and 99 interposing the channel region 95 therebetween and an isolating film 92 are selectively formed in a main surface of a semiconductor substrate 91.

The semiconductor substrate 91 is a silicon substrate containing a P-type impurity, and the source-drain regions 98 and 99 contain an N-type impurity. A gate electrode 94 is opposed to an upper surface of the channel region 95 with a gate insulating film 93 interposed therebetween. In other words, the device 150 is constituted as an N-channel type MOS transistor. The gate electrode 94 is formed of polysilicon doped with an N-type impurity.

The gate insulating film 93 is constituted as a silicon oxide film having a thickness of 5 nm, for example. The isolating film 92 is constituted as a silicon oxide film buried in a trench having a depth of approximately 0.3 μm which is formed to surround the channel region 95 and the source-drain regions 98 and 99. More specifically, the isolating film 92 constitutes a trench isolation structure. Consequently, the channel region 95 and the source-drain regions 98 and 99 are isolated from other elements (for example, other channel regions and source-drain regions which are not shown) formed on the main surface of the semiconductor substrate 91.

An upper surface of the isolating film 92 is on a level with upper surfaces of the channel region 95 and the source-drain regions 98 and 99. For this reason, the gate electrode 94 is opposed to only the upper surface of the channel region 95. Accordingly, a direction in which an electric field is to be applied from the gate electrode 94 to the channel region 95 is restricted to a vertical direction with respect to the same upper surface.

In the conventional MOS semiconductor device, as described above, the electric field to be applied from the gate electrode 94 to the channel region 95 is restricted to that in the vertical direction with respect to the upper surface. Therefore, there is a problem in that control capabilities of the gate electrode 94 for the channel region 95 are low. Accordingly, as a gate length is reduced with microfabrication of a device, the influence of a drain field is increased so that a threshold is reduced considerably. Thus, a so-called "short channel effect" is caused.

In FIGS. 61 and 62, a channel depletion layer 95a generated by a gate field and a drain depletion layer 99a generated by a drain field come in contact with each other at a gate-drain end (that is, an end of the channel region 95 which is adjacent to the drain region 99) and a space charge is distributed through so-called "charge share". These depletion layers are generated when a gate voltage $V_G$ is higher than zero ($0<V_G$) and a drain voltage $V_D$ is higher than zero ($0<V_D$). When the gate length is reduced, a ratio of the drain depletion layer 99a to the channel depletion layer 95a is increased so that a threshold voltage is largely influenced by the drain voltage. Consequently, the threshold voltage is reduced. This implies the short channel effect.

SUMMARY OF THE INVENTION

In order to solve the above-mentioned problems of the conventional art, it is an object of the present invention to provide a MOS semiconductor device capable of suppressing a short channel effect of a threshold voltage and a method suitable for manufacturing the MOS semiconductor device.

A first aspect of the present invention is directed to a MOS semiconductor device comprising: a semiconductor layer which has a channel region and a pair of source drain regions interposing the channel region therebetween; an isolating film formed on a surface of the semiconductor layer to surround the channel region and the pair of source drain regions; and a gate electrode formed on side surfaces of the channel region that expose to a trench formed on surface portions of the isolating film adjacent to the channel region and on an upper surface of the channel region with a gate insulating film interposed therebetween, thereby covering the upper surface and the at least a part of the side surfaces in the channel region with the gate insulating film interposed therebetween and setting a gate upper surface step defined by a step between an upper surface of a portion covering the channel region and an upper surface of a portion covering the isolating film to be equal to or smaller than a half of a gate length defined by a width of the portion covering the channel region.

Preferably, the trench is formed in such a depth that almost whole side surfaces of the channel region expose, and the gate electrode covers the almost whole side surfaces of the channel region with the gate insulating film interposed therebetween.

A second aspect of the present invention is directed to the MOS semiconductor device according to the first aspect of the present invention, wherein the isolating film has a first isolating film and a second isolating film which are formed of materials different from each other, the first isolating film is provided between the semiconductor layer and the second isolating film so as to cover a bottom surface and a part of side surface of the second isolating film, and the trench is formed on a surface of the first isolating film to expose the first isolating film on its bottom, to expose the channel region on its first side surfaces and to expose the second isolating film on its second side surfaces facing to the first side surfaces.

A third aspect of the present invention is directed to the MOS semiconductor device according to the first aspect of the present invention, wherein the semiconductor layer is an SOI layer of an SOI substrate having a semiconductor substrate, an insulating layer and the SOI layer that are formed one on another in this order.

A fourth aspect of the present invention is directed to the MOS semiconductor device according to the third aspect of the present invention, wherein the trench is formed in such a depth that the insulating layer exposes, and the gate electrode covers almost whole side surfaces of the channel region with the gate insulating film interposed therebetween.

A fifth aspect of the present invention is directed to the MOS semiconductor device according to the fourth aspect of the present invention, wherein the trench is formed to expose at least a part of a bottom surface of the channel region, and the gate electrode covers the at least a part of the bottom surface of the channel region with the gate insulating film interposed therebetween.

A sixth aspect of the present invention is directed to a MOS semiconductor device comprising: an SOI substrate having a semiconductor substrate, an insulating layer and a semiconductor layer that are formed one on another in this order, the semiconductor layer having a channel region and a pair of source drain regions interposing the channel region, and the channel region being provided with a space between the insulating layer and itself in a part of a bottom surface thereof; and a gate electrode covering a part of a surface of the channel region with the gate insulating film interposed therebetween, the part of the surface of the channel region having contact neither with the pair of source drain regions nor with the insulating layer.

A seventh aspect of the present invention is directed to the MOS semiconductor device according to the first, third or sixth aspect of the present invention, wherein a width of the trench is equal to or smaller than a double of a thickness of the gate electrode.

An eighth aspect of the present invention is directed to the MOS semiconductor device according to the first, third or sixth aspect of the present invention, wherein a channel width of the channel region is set to be equal to or smaller than a double of a maximum channel depletion layer width.

A ninth aspect of the present invention is directed to the MOS semiconductor device according to the first, third or sixth aspect of the present invention, wherein the semiconductor layer is divided into a plurality of unit semiconductor layers arranged in a direction of a channel width with a space therebetween, and a pair of side surfaces and an upper surface of a channel region of each of the unit semiconductor layers are covered by the gate electrode with the insulating film interposed therebetween.

A tenth aspect of the present invention is directed to a method of manufacturing a MOS semiconductor device comprising the steps of (a) preparing a substrate having a semiconductor at least in a portion of a main surface thereof, (b) selectively etching the main surface to cause the main surface to selectively recede, thereby forming a semiconductor layer selectively protruded upward from the main surface which has receded, (c) forming an isolating film on the main surface receding at the step (b) to surround the semiconductor layer leaving a trench to which at least a part of a pair of side surfaces of a partial region of the semiconductor layer are exposed as side walls, (d) forming an insulating film to cover the upper surface and the at least a part of the side surfaces of the partial region after the step (b) or the step (c), (e) after the step (d), forming a conductive material to cover the partial region of the semiconductor layer, the trench and the upper surface of the isolating film thereacross, thereby forming a gate electrode such that the upper surface and the at least a part of the side surfaces of the partial region are covered by the gate electrode with the insulating film interposed therebetween and a gate upper surface step defined by a step between an upper surface of a portion covering the partial region and an upper surface of a portion covering the isolating film is set to be equal to or smaller than a half of a gate length defined by a width covering the partial region, and (f) selectively introducing an impurity by using the gate electrode as a shield to form a pair of source drain regions in a pair of regions in the semiconductor layer with the partial region interposed therebetween, thereby causing the partial region to be a channel region.

An eleventh aspect of the present invention is directed to the method of manufacturing a MOS semiconductor device according to the tenth aspect of the present invention, wherein the conductive material is formed in a thickness which is equal to or larger than a half of a width of the trench at the step (e).

A twelfth aspect of the present invention is directed to the method of manufacturing a MOS semiconductor device according to the tenth or eleventh aspect of the present invention, wherein an SOI substrate having an insulating layer and an SOI layer formed thereon is prepared as the substrate at the step (a).

A thirteenth aspect of the present invention is directed to the method of manufacturing a MOS semiconductor device according to the twelfth aspect of the present invention, wherein the selective etching for causing the main surface to selectively recede is carried out until the insulating layer is exposed in a portion where the semiconductor layer is not protruded at the step (b), and the isolating film is formed at the step (c) such that a bottom surface of the trench reaches the insulating layer, and thereby at the step (e), the gate electrode is formed to cover almost the whole side surfaces in addition to the upper surface of the partial region with the insulating film interposed therebetween.

A fourteenth aspect of the present invention is directed to the method of manufacturing a MOS semiconductor device according to the thirteenth aspect of the present invention, further comprising the step of (g) after the step (c) and before the step (d), selectively forming a cavity to be coupled to the trench in a surface portion of the insulating layer such that at least a part of a bottom surface of the partial region is exposed, the insulating film being formed to cover the at least a part of the bottom surface in addition to the upper and side surfaces of the partial region at the step (d), and the conductive material being formed at the step (e) to fill up the cavity formed at the step (g) so that the gate electrode is formed to cover the at least a part of the bottom surface in addition to the upper and side surfaces of the partial region with the insulating film interposed therebetween.

A fifteenth aspect of the present invention is directed to the method of manufacturing a MOS semiconductor device according to any of the tenth to twelfth aspects of the present invention, wherein the step (c) includes the steps of (c-1) depositing a material of the isolating film on the substrate to cover the semiconductor layer, (c-2) causing an upper surface of the material of the deposited isolating film to recede to approach a level of an upper surface of the semiconductor layer, and (c-3) after the step (c-2), selectively etching the material to cause the upper surface of the material to recede downward. from the upper surface of the semiconductor layer in a portion adjacent to the side surfaces of the partial region, thereby forming the trench.

A sixteenth aspect of the present invention is directed to the method of manufacturing a MOS semiconductor device according to any of the tenth to twelfth aspects of the present invention, wherein the step (c) further includes the steps of (c-1) depositing a first insulating material to cover the receding main surface and the upper and side surfaces of the semiconductor layer in a smaller thickness than a height of the semiconductor layer from the receding main surface, (c-2) depositing a second insulating material different from the first insulating material on the first insulating material, (c-3) causing an upper surface of a composite material including the first and second insulating materials which are deposited to recede to approach a level of the upper surface of the semiconductor layer, and (c-4) after the step (c-3), carrying out selective etching having a higher etching effect for the first insulating material than the second insulating material, thereby causing an upper surface of the first insulating material to recede downward from the upper surface of the semiconductor layer in a portion adjacent to the side surfaces of the partial region, resulting in formation of the trench.

A seventeenth aspect of the present invention is directed to the method of manufacturing a MOS semiconductor device according to any of the tenth to sixteenth aspects of the present invention, wherein, at the step (c), the isolating film is formed such that an upper surface step defined by a step between the upper surface of the semiconductor layer and the upper surface of the isolating film is set to be equal to or smaller than a half of the gate length.

An eighteenth aspect of the present invention is directed to a method of manufacturing a MOS semiconductor device comprising the steps of (a) preparing an SOI substrate having an insulating layer and an SOI layer formed thereon, (b) selectively etching the SOI layer to cause a main surface of the SOI layer to selectively recede until the insulating layer is selectively exposed, thereby forming a semiconductor layer which is selectively protruded upward from the main surface after the receding, (c) selectively forming a cavity in a surface portion of the insulating layer such that a part of a bottom surface of a partial region of the semiconductor layer is exposed, (d) forming an insulating film to cover an upper surface, a pair of side surfaces and the part of the bottom surface in the partial region, (e) after the step (d), forming a conductive material to fill up the cavity and to cover the partial region, thereby forming a gate electrode to cover the upper surface, the side surfaces and the part of the bottom surface in the partial region with the insulating film interposed therebetween, and (f) selectively introducing an impurity by using the gate electrode as a shield, thereby forming a pair of source drain regions in a pair of regions in the semiconductor layer which interpose the partial region therebetween so that the partial region is caused to be a channel region.

A nineteenth aspect of the present invention is directed to the method of manufacturing a MOS semiconductor device according to any of the tenth to eighteenth aspects of the present invention, wherein a width of the partial region corresponding to a channel width of the channel region is set to be equal to or smaller than a double of a maximum channel depletion layer width at the step (b).

A twentieth aspect of the present invention is directed to the method of manufacturing a MOS semiconductor device according to any of the tenth to eighteenth aspects of the present invention, wherein a region to be the partial region at the step (c) is divided into a plurality of unit regions arranged in a direction of a width corresponding to the channel width of the channel region at the step (b), the insulating film is formed to cover at least a part of a pair of side surfaces and an upper surface in each of the unit regions at the step (d), and a conductive material is formed on the insulating film at the step (e) so that the gate electrode is formed to cover the upper surface and the at least a part of the side surfaces in each of the unit regions with the insulating film interposed therebetween.

A twenty-first aspect of the present invention is directed to the method of manufacturing a MOS semiconductor device according to the twentieth aspect of the present invention, wherein the channel width of each of plurality of unit channel regions formed by the plurality of unit regions is set to be equal to or smaller than a double of a maximum channel depletion layer width at the step (b).

A twenty-second aspect of the present invention is directed to a method of manufacturing a MOS semiconductor device comprising the steps of (a) preparing a substrate having a semiconductor at least in a portion of a main surface thereof, (b) selectively etching the main surface to cause the main surface to selectively recede, thereby forming a semiconductor layer selectively protruded upward from the main surface which has receded, (c) forming an isolating film on the main surface receding at the step (b) to surround the semiconductor layer and to cause an upper surface to be on a level with an upper surface of the semiconductor layer, (d) forming a sacrificial layer to cover an upper surface of a partial region of the semiconductor layer and an upper surface portion of the isolating film adjacent thereto, (e) selectively introducing an impurity by using the sacrificial layer as a shield, thereby forming a pair of source drain regions in a pair of regions in the semiconductor layer interposing the partial region therebetween so that the partial region is caused to be a channel region, (f) forming an insulating layer formed of a different material from that of the sacrificial layer to cover a portion which is not covered by the sacrificial layer over the upper surface of the semiconductor layer and the upper surface of the isolating film, (g) carrying out selective etching having a higher etching effect for the sacrificial layer than the insulating layer, thereby removing the sacrificial layer, (h) executing selective etching using the insulating layer as a shield, thereby causing the upper surface portion of the isolating film to recede downward from the upper surface of the semiconductor layer, (i) forming an insulating film to cover an exposed portion of an upper surface and a pair of side surfaces in the channel region of the semiconductor layer, and (j) forming a conductive material on the insulating film, thereby forming a gate electrode to cover the upper surface and at least a part of the side surfaces in the channel region with the insulating film interposed therebetween.

A twenty-third aspect of the present invention is directed to the method of manufacturing a MOS semiconductor device according to the twenty-second aspect of the present invention, wherein a width of a region to be the partial region corresponding to a channel width of the channel region is set to be equal to or smaller than a double of a maximum channel depletion layer width at the step (b).

A twenty-fourth aspect of the present invention is directed to the method of manufacturing a MOS semiconductor device according to the twenty-second or twenty-third aspect of the present invention, wherein an SOI substrate having an insulating layer and an SOI layer formed thereon is prepared as the substrate at the step (a), the selective etching for causing the main surface to selectively recede is carried out until the insulating layer is exposed in a portion where the semiconductor layer is not protruded at the step (b), and the selective etching for causing the upper surface portion of the isolating film to recede downward is carried out until the insulating layer is exposed at the step (h), the manufacturing method further comprising the step of (k) selectively removing a surface portion of the insulating layer such that a bottom surface of the channel region is exposed after the step (h) and before the step (i), the insulating film being formed to cover the bottom surface in addition to the upper surface and the side surfaces in the channel region at the step (i), and the conductive material being formed on the insulating film at the step (j) so that the gate electrode is formed to cover the bottom surface in addition to the upper surface and the side surfaces in the channel region with the insulating film interposed therebetween.

According to the first aspect of the present invention, the side surfaces as well as the upper surface of the channel region are covered by the gate electrode. Therefore, a short channel effect can be suppressed. Moreover, since the isolating film surrounds the semiconductor layer, an electrical isolation between the semiconductor layer and other elements can be implemented. In addition, the step of the upper surface of the gate electrode is limited to an optimal range. In the process for manufacturing the device, therefore, it is possible to relieve the problem of a halation, thereby setting a thinned portion of the gate electrode within such a range as to have no practical problem. Thus, a device having high precision can be implemented.

According to the second aspect of the present invention, the isolating film does not have the second isolating film in the portion provided under the bottom surface of the trench but has the second isolating film in other portions. Therefore, the trench can easily be formed by using selective etching having a larger etching effect for the first isolating film than the second isolating film.

According to the third aspect of the present invention, it is possible to obtain an advantage that a short channel effect can be suppressed for the device using the SOI substrate.

According to the fourth aspect of the present invention, almost the whole side surfaces of the channel region are covered by the gate electrode. Therefore, the short channel effect can be suppressed more considerably.

According to the fifth aspect of the present invention, at least a part of the bottom surface of the channel region is covered by the gate electrode. Therefore, the short channel effect can be suppressed much more considerably.

According to the sixth aspect of the present invention, the bottom surface of the channel region is covered by the gate electrode leaving a part thereof. Therefore, the short channel effect can be suppressed much more considerably. In addition, a part of the bottom surface of the channel region is coupled to the insulating layer. Therefore, a mechanical strength in the process for manufacturing the device can be increased. As a result, manufacturing yield can be enhanced.

According to the seventh aspect of the present invention, the width of the trench is set to be equal to or smaller than a double of the thickness of the gate electrode. Therefore, the problem of a focal depth can be eliminated so that the gate electrode can be provided with high precision. In other words, a device having higher precision can be implemented.

According to the eighth aspect of the present invention, the channel width is set to be equal to or smaller than a double of the maximum channel depletion layer width. Therefore, the short channel effect can be suppressed more effectively.

According to the ninth aspect of the present invention, the semiconductor layer is divided into a plurality of unit semiconductor layers arranged in the direction of the channel width with a space therebetween. The upper surface and the side surfaces in the channel region of each of the unit semiconductor layers are covered by the gate electrode with the insulating film interposed therebetween. Therefore, the short channel effect can be suppressed and a current capacity can be increased without an enlargement in an area as compared with a conventional device.

According to the tenth aspect of the present invention, at least a part of the side surfaces as well as the upper surface of the channel region are covered by the gate electrode. Therefore, it is possible to obtain a MOS semiconductor device in which the short channel effect can be suppressed. Moreover, the isolating film is formed to surround the semiconductor layer. Therefore, an electric isolation between the semiconductor layer and other elements can be implemented. In addition, the step of the upper surface of the gate electrode is limited to an optimal range. Therefore, it is possible to relieve the problem of a halation, thereby setting the thinned portion of the gate electrode within such a range as to have no practical problem. Furthermore, the impurity is selectively introduced by using the gate electrode as the shield. Consequently, a pair of source drain regions can be formed in self-alignment.

According to the eleventh aspect of the present invention, the width of the trench is set to be equal to or smaller than a double of the thickness of the gate electrode. Therefore, the problem of a focal depth can be relieved so that the gate electrode can be provided with higher precision.

According to the twelfth aspect of the present invention, a device having an advantage that the short channel effect can be suppressed can be fabricated in the SOI substrate.

According to the thirteenth aspect of the present invention, almost the whole side surfaces of the channel region are covered by the gate electrode. Therefore, it is possible to obtain a device in which the short channel effect can be suppressed more remarkably.

According to the fourteenth aspect of the present invention, at least a part of the bottom surface of the channel region is covered by the gate electrode. Therefore, it is possible to obtain a device in which the short channel effect can be suppressed much more remarkably.

According to the fifteenth aspect of the present invention, the isolating film is subjected to the selective etching so that the trench is formed. Therefore, the trench can be formed easily.

According to the sixteenth aspect of the present invention, the upper surface of the first insulating material is caused to recede by using the selective etching having a larger etching effect for the first insulating material than the second insulating material. Thus, the upper surface of the isolating film is caused to recede in the portion adjacent to the channel region. Consequently, the receding surface of the isolating film in which the gate electrode is buried is formed in self-alignment without using a mask pattern which needs alignment.

According to the seventeenth aspect of the present invention, the step between the height of the upper surface of the isolating film and that of the upper surface of the semiconductor layer is limited to the optimal range. Therefore, it is possible to relieve the problem of a halation, thereby setting the thinned portion of the gate electrode within such a range as to have no practical problem without adding a special step to the step of forming the gate electrode.

According to the eighteenth aspect of the present invention, a part of the bottom surface of the channel region is covered by the gate electrode. Therefore, it is possible to obtain a device in which the short channel effect can be suppressed much more remarkably. In addition, the cavity is formed such that a portion to be coupled to the insulating layer remains on the bottom surface of the channel region. Therefore, a mechanical strength can be increased. As a result, manufacturing yield can be enhanced.

According to the nineteenth aspect of the present invention, the channel width is set to be equal to or smaller than a double of the maximum channel depletion layer width. Therefore, it is possible to obtain a device in which the short channel effect can be suppressed more effectively.

According to the twentieth aspect of the present invention, the channel region is divided into a plurality of unit channel regions arranged in the direction of the channel width. The upper surface and at least a part of the side surfaces in each of the unit channel regions are covered by the gate electrode with the insulating film interposed therebetween. Therefore, it is possible to obtain a device in which the short channel effect can be suppressed and a current capacity can be increased without an enlargement in an area as compared with a conventional device.

According to the twenty-first aspect of the present invention, the channel width of each of the unit channel regions is set to be equal to or smaller than a double of the maximum channel depletion layer width. Therefore, it is possible to obtain a device in which the short channel effect can be suppressed more effectively.

According to the twenty-second aspect of the present invention, by using the insulating layer as a shield which is formed as a mold through the Damascene method, the upper surface of the isolating film is caused to recede in the portion adjacent to the channel region. Consequently, the receding surface of the isolating film in which the gate electrode is buried is formed in self-alignment without using a mask pattern which needs alignment.

According to the twenty-third aspect of the present invention, the channel width is set to be equal to or smaller than a double of the maximum channel depletion layer width. Therefore, it is possible to obtain a device in which the short channel effect can be suppressed more effectively.

According to the twenty-fourth aspect of the present invention, the channel region is formed to float above the receding main surface of the substrate and the gate electrode is formed to cover the upper surface, the pair of side surfaces and the bottom surface in the channel region with the insulating film interposed therebetween. Therefore, it is possible to obtain a device in which the short channel effect can be suppressed more remarkably.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 6 to 17 are views showing a manufacturing process for a manufacturing method according to the first embodiment, FIG. 24 is a plan view showing a device according to a third embodiment, FIG. 25 is a sectional view showing the device according to the third embodiment, FIGS. 49 to 56 are views showing a manufacturing process for a manufacturing method according to the seventh embodiment, FIG. 57 is a sectional view showing a device according to an eighth embodiment, FIG. 58 is a plan view showing the device according to the eighth embodiment.

DESCRIPTION OF THE PREFERRED EMBODIMENTS

While an N-type MOS transistor will be described in each of the following embodiments, the MOS semiconductor device according to the present invention can also be applied to a P-type MOS transistor and can further be applied to a general semiconductor device having a MOS structure other than the MOS transistors.

First Embodiment

Figure 1:
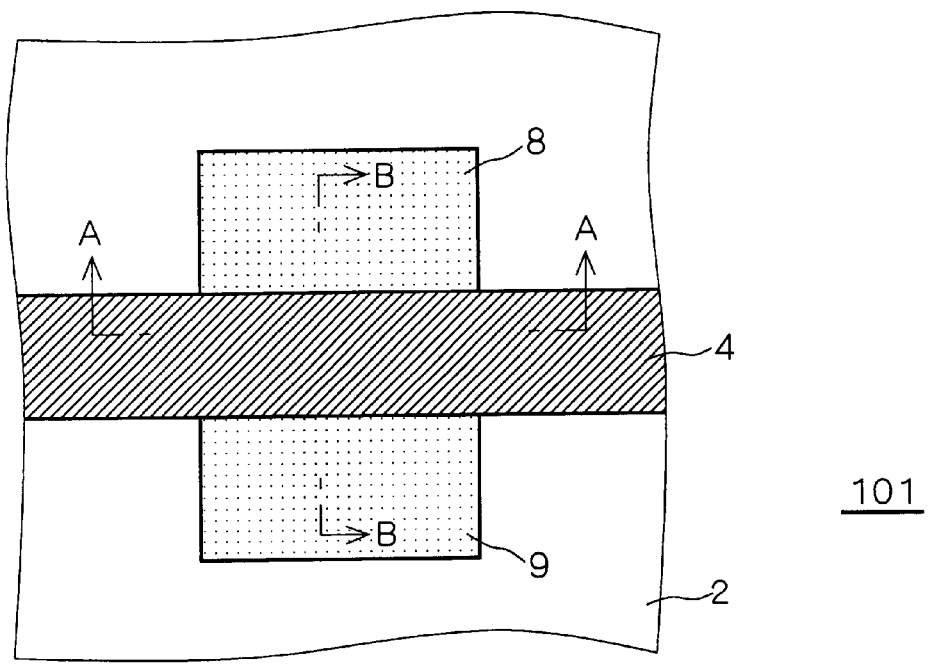
FIG. 1 is a plan view showing a device according to a first embodiment.
Figure 2:
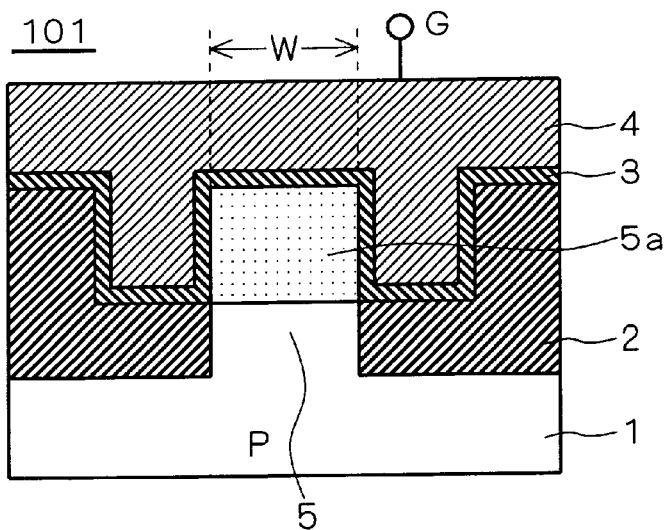
FIGS. 2 and 3 are sectional views showing the device according to the first embodiment.
Figure 3:
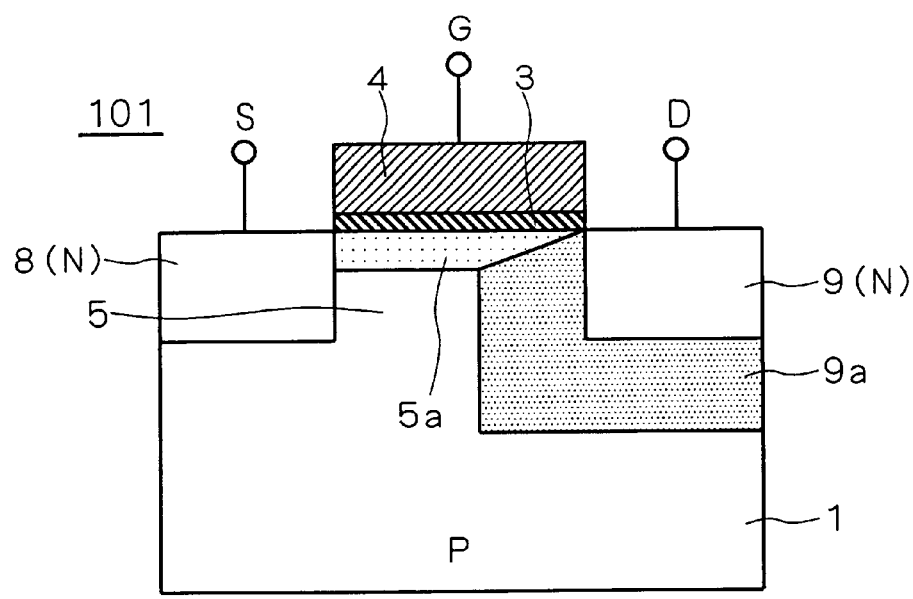

FIG. 1 is a plan view showing a MOS semiconductor device according to a first embodiment. FIGS. 2 and 3 are sectional views showing the device taken along the lines A—A and B—B in FIG. 1, respectively. The device 101 is constituted as an N-channel MOS transistor in which a channel region 5, a pair of source-drain regions 8 and 9 interposing the channel region 5 therebetween and an isolating film 2 are selectively formed in a main surface of a semiconductor substrate 1.

The semiconductor substrate 1 is a silicon substrate containing a P-type impurity, and the source-drain regions 8 and 9 contain an N-type impurity. The isolating film 2 is constituted as a silicon oxide film buried in a trench having a depth of approximately 0.3 µm which is formed to surround the channel region 5 and the source-drain regions 8 and 9. More specifically, the isolating film 2 constitutes a trench isolation structure.

In other words, the channel 5 and the pair of source-drain regions 8 and 9 are formed in a semiconductor layer selectively protruded upward from the main surface of the semiconductor substrate 1 in the device 101. To surround the semiconductor layer, the isolating film 2 is formed on the main surface which is not protruded. Consequently, the semiconductor layer is isolated from other elements (for example, other semiconductor layers which are not shown) formed in the main surface of the semiconductor substrate 1.

The isolating film 2 has a trench provided in a portion adjacent to a pair of side surfaces of the channel region 5, and an upper surface of the isolating film 2 is set to be lower than upper surfaces of the channel region 5 and the source-drain regions 8 and 9 by approximately 150 nm in the trench portion. More specifically, the isolating film 2 is thin in a portion adjacent to the side surfaces of the channel region 5 and is thickly formed such that the upper surface thereof is almost on a level with that of the semiconductor layer in other regions. A gate electrode 4 is formed across the channel region 5, the trench portion of the isolating film 2 and the isolating film 2 portion in which the upper surface thereof is almost on a level with that of the semiconductor layer.

Consequently, a part of the side surfaces as well as the upper surface of the channel region 5 are covered by a gate insulating film 3 and is covered by the gate electrode 4 with the gate insulating film 3 interposed therebetween. As a result, it is possible to obtain an advantage that a short channel effect can be suppressed as will be described below. Moreover, a portion between the gate electrode 4 and the main surface which is not protruded is insulated by the isolating film 2. Therefore, the gate electrode 4 can cover the side surfaces of the channel region 5 while reducing a parasitic capacitance between the gate electrode 4 and the main surface of the semiconductor substrate 1.

Furthermore, the isolating film 2 is formed such that the upper surface thereof is almost on a level with that of the semiconductor layer except for the trench portion. As will be described below, therefore, it is possible to obtain an advantage that the gate electrode 4 can be formed to have a predetermined shape with high precision in a process for manufacturing the device. The material of the gate electrode 4 is polysilicon doped with an N-type impurity, for example.

Preferably, a channel width W of the channel region 5 is set to have a value which is equal to or smaller than a double of a maximum channel depletion layer width Xdm. Consequently, the short channel effect can be suppressed more effectively as will be described below. The maximum channel depletion layer width Xdm is approximately 0.07 µm, for example. In this case, the channel width W is set to 0.10 µm, for example. The maximum channel depletion layer Xdm is defined as follows.

In a MOS structure, when a gate voltage is applied to the gate electrode 4, a depletion layer is formed in the channel region 5. The depletion layer is enlarged with the gate voltage. When an inversion layer is formed on a surface of the channel region 5, a gate field is consumed for generating an inversion carrier in the inversion layer even if a higher gate voltage is applied. Therefore, the depletion layer is not enlarged any more. The maximum depletion layer width is referred to as the maximum channel depletion layer width Xdm. The maximum channel depletion layer width Xdm is determined by an impurity concentration in the channel region 5.

As shown in FIG. 3, a channel depletion layer 5a generated by a gate field and a drain depletion layer 9a generated by a drain field come in contact with each other at a gate-drain end (that is, an end of the channel region 5 which is adjacent to the drain region 9) and a space charge is distributed through so-called "charge share". These depletion layers are generated when a gate voltage $V_G$ is larger than zero ($0<V_G$) and a drain voltage $V_D$ is larger than zero ($0<V_D$). In the device 101, the gate electrode 4 is opposed to a part of the side surfaces as well as the upper surface of the channel region 5. Referring to the charge share, therefore, a ratio of the channel depletion layer 5a is higher than that of the drain depletion layer 9a. Accordingly, even if a gate length is reduced with microfabrication of the device 101, the influence of the drain voltage on a threshold voltage can be relieved. In other words, the short channel effect can be suppressed.

In particular, when the channel width W is set to be equal to or smaller than a double of the maximum channel depletion layer width Xdm, the channel regions 5 is completely depleted from the upper surface of the channel region 5 down to such a depth that the gate electrode 4 is opposed to the side surface thereof. This complete depletion layer is caused by the electric field generated from the gate electrode 4 opposed to the side surfaces of the channel region 5 as shown in FIG. 2. Accordingly, the influence of the drain voltage on the threshold voltage can be suppressed more effectively. In other words, the short channel effect can be suppressed more effectively.

Figure 4:
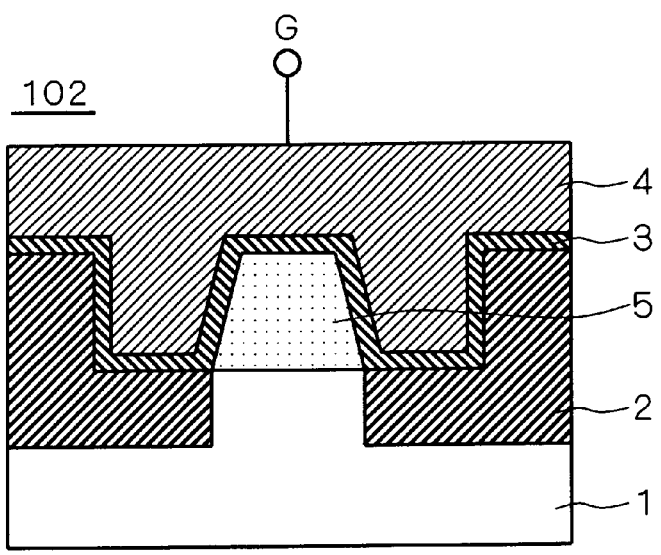
FIG. 4 is a sectional view showing a device according to another example of the first embodiment.
Figure 5:
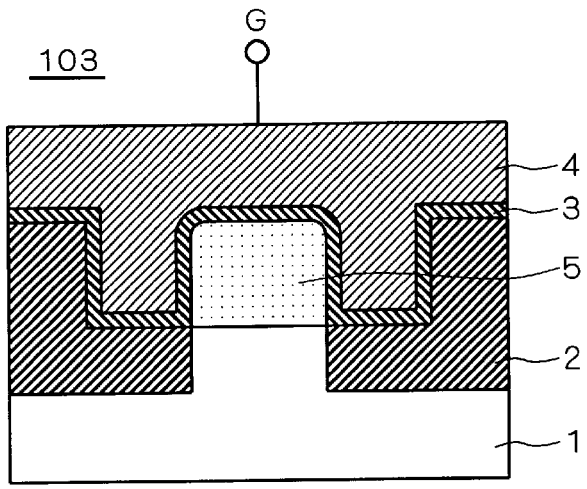
FIG. 5 is a sectional view showing a device according to a further example of the first embodiment.

While FIG. 2 shows an example in which the channel region 5 has a rectangular section, the same effects can be obtained in a device 102 in which the channel region 5 has a trapezoidal section as shown in FIG. 4 or a device 103 in which the channel region 5 has a rounded top corner as shown in FIG. 5. In the examples of FIGS. 4 and 5, for instance, it is preferable that a mean channel width in a channel to which the gate electrode 4 is opposed should be employed as the channel width W.

Figure 6:
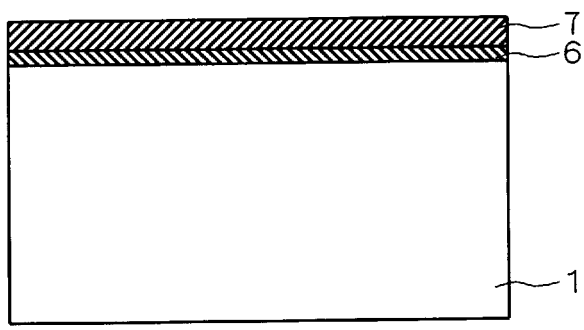

FIGS. 6 to 17 are views showing a manufacturing process for a preferred method of manufacturing the device 101. In order to manufacture the device 101, first of all, a semiconductor substrate 1 being a silicon substrate is prepared, and a substrate oxide film 6 having a thickness of approximately 20 nm is formed on a main surface of the semiconductor substrate 1 by thermal oxidation at 1000° C. Furthermore, CVD (chemical vapor deposition) is carried out at 750° C. so that a mask nitride film 7 having a thickness of approximately 50 nm is formed on the substrate oxide film 6 (FIG. 6).

Figure 7:
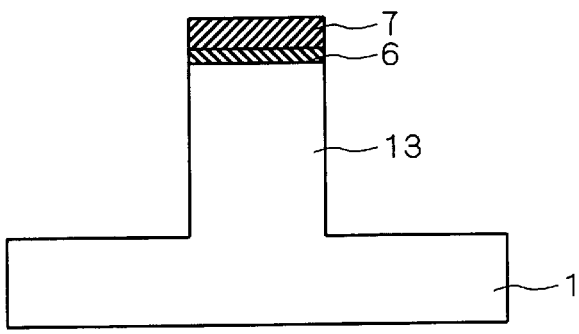
Figure 8:
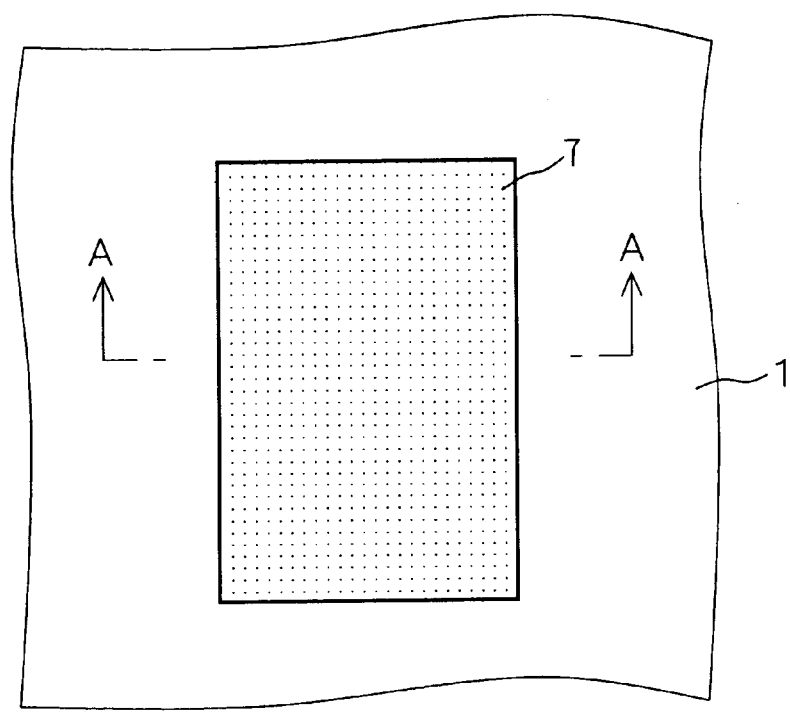

Next, the substrate oxide film 6 and the mask nitride film 7 are patterned to have a planar shape of a semiconductor layer 13 including a channel region 5 and source-drain regions 8 and 9 which are to be formed. Subsequently, the main surface of the semiconductor substrate 1 is subjected to selective etching by using the patterned substrate oxide film 6 and mask nitride film 7 as a shield. Consequently, the main surface is caused to selectively recede by approximately 0.3 µm (FIGS. 7 and 8). More specifically, a trench having a depth of approximately 0.3 µm is formed around the semiconductor layer 13. In other words, a structure in which the semiconductor layer 13 is selectively protruded upward from the main surface after the receding.

It is preferable that an anisotropic plasma etching method should be employed for the selective etching of the semiconductor substrate 1, for example. FIG. 8 is a plan view showing a structure obtained after this step and FIG. 7 is a sectional view taken along the line A—A in FIG. 8 (the same position as that of the line A—A in FIG. 1).

Preferably, pattern shapes of the substrate oxide film 6 and the mask nitride film 7 shown in FIG. 7 are determined such that a width (a lateral width of the semiconductor layer 13 in FIG. 7) corresponding to a channel width of a partial region in the semiconductor layer 13 which is to be the channel region 5 is equal to or smaller than a double of a maximum channel depletion layer width Xdm.

Figure 9:
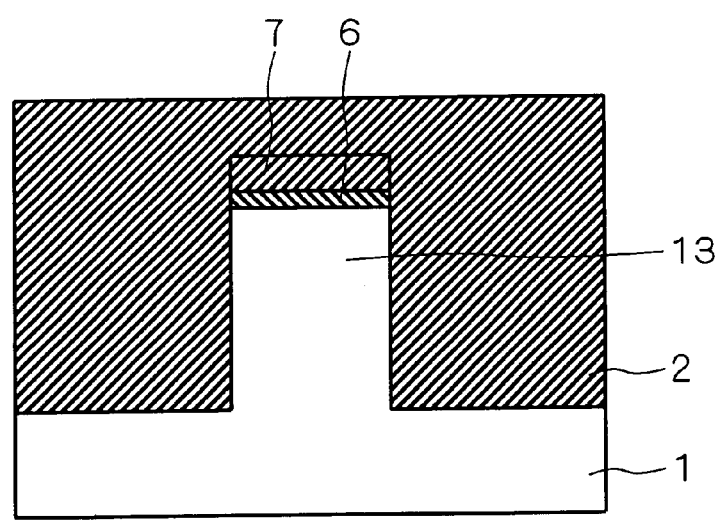

Next, an oxide film to be an isolating film 2 is deposited on the semiconductor substrate 1 to cover the semiconductor layer 13 by high density plasma CVD (HDP-CVD) (FIG. 9). Then, the isolating film 2 is removed by chemical mechanical polishing (CMP) until an upper surface of the mask nitride film 7 is exposed (FIG. 10). As shown in a plan view of FIG. 11, thereafter, a resist pattern having an opening 12 is formed on an upper surface of an intermediate structure formed at the step of FIG. 10.

Subsequently, selective etching is carried out by using the resist pattern as a shield and hydrofluoric acid as an etchant. Consequently, an upper surface of the isolating film 2 is caused to recede downward only in a portion adjacent to a pair of side surfaces in a partial region of the semiconductor layer 13 which is to be the channel region 5. FIGS. 12 and 13 are sectional views showing an intermediate structure thus obtained. FIG. 12 is a sectional view showing the intermediate structure obtained after the etching, which is taken along the line D—D in FIG. 11, and FIG. 13 is a sectional view taken along the line E—E. In FIG. 11, the reference numeral 14 denotes a pattern shape of a gate electrode 4 to be formed at a subsequent step. A thickness of the isolating film 2 in a portion in which the upper surface recedes is set to approximately 150 nm, for example.

Figure 15:
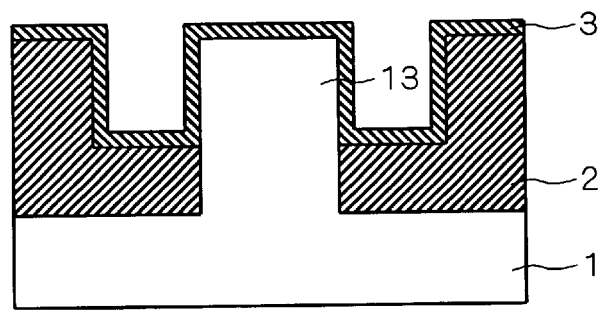

Then, the mask nitride film 7 and the substrate oxide film 6 are removed by etching using a high temperature phosphoric acid solution and a hydrofluoric acid solution as etchants (FIG. 14). The mask nitride film 7 and the substrate oxide film 6 may be removed after the removal of the isolating film 2. Thereafter, an oxide film to be a gate insulating film 3 is formed in a thickness of approximately 5 nm over the whole surface of the intermediate structure obtained after the step of FIG. 14 through the thermal oxidation at 850° C. (FIG. 15). Consequently, a part of the side surfaces and an upper surface in the partial region of the semiconductor layer 13 which is to be the channel region 5 are covered by the gate insulating film 3.

Figure 16:
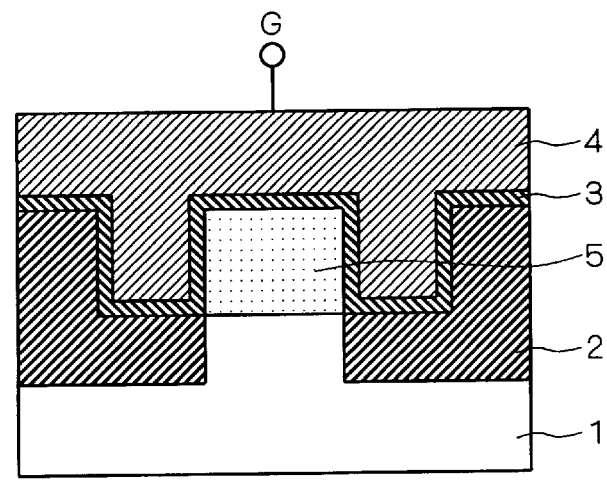
Figure 17:
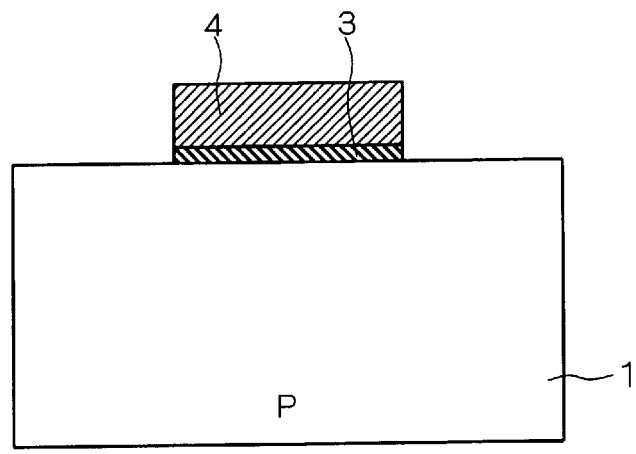

Next, an N-type polysilicon film containing an N-type impurity which is to be the gate electrode 4 is deposited in a thickness of approximately 200 nm by LP-CVD at 600° C. (FIG. 16). Then, the N-type polysilicon film is patterned to have a predetermined shape by lithography and plasma processing. Thus, the gate electrode 4 is formed (FIG. 17). The gate electrode 4 is formed to cover a partial region of the semiconductor layer 13 to be the channel region 5, a portion of a trench of the isolating film 2 and the isolating film 2 portion in which an upper surface thereof is almost on a level with that of the semiconductor layer 13 thereacross. As a result, the gate electrode 4 is formed to cover at least a part of the side surfaces and the upper surface in the partial region of the semiconductor layer 13 which is to be the channel region 5 with the gate insulating film 3 interposed therebetween.

As is well known, a lens of an exposing device to be used for the lithography has a focal depth within a certain range. Therefore, there is a problem in that it is hard to make a patterning dimension uniform if a height of a film to be patterned is not uniform. Since the upper surface of the isolating film 2 is almost on a level with that of the semiconductor layer 13 at the step of FIG. 17, a height of the upper surface of the N-type polysilicon film formed thereon can be almost uniform. Accordingly, the problem of the focal depth can be relieved so that the gate electrode 4 can be formed to have a predetermined shape with high precision. Referring to the height of the upper surface of the isolating film 2 and that of the upper surface of the semiconductor layer 13 (that is, the upper surface of the channel region 5), a preferable range of "almost equal" will be described in detail in an eighth embodiment.

Although the upper surface of the isolating film 2 recedes downward in a trench portion adjacent to the partial region of the semiconductor layer 13, a width of the trench (a lateral width in FIG. 16) can be set to be small within a range in which the gate electrode 4 can be buried. Therefore, a pattern dimension can be managed with sufficient precision.

In particular, in the case in which the width of the trench is set to be equal to or smaller than a double of the thickness of the N-type polysilicon to be deposited, a height of the upper surface of the N-type polysilicon film including a portion over the trench is made uniform as shown in FIG. 16. In this case, the problem of the focal depth in the lithography can be eliminated completely and the gate electrode 4 can be formed with higher precision.

When the step of FIG. 17 is completed, arsenic to be an N-type impurity is selectively implanted into the semiconductor layer at a density of $1 \times 10^{15}$ cm$^{-2}$ by ion implantation using the gate electrode 4 as a shield. Then, annealing is carried out at 900° C. so that source/drain regions 8 and 9 are formed in a pair of regions interposing a portion in the semiconductor layer 13 directly under the gate electrode 4 (that is, the partial region) (FIGS. 1 to 3). The partial region in the semiconductor layer 13, where the arsenic is not introduced, functions as the channel region 5. Thus, the source/drain regions 8 and 9 are formed in self-alignment.

Thereafter, an interlayer insulating film, an aluminum contact hole and an aluminum wiring are formed at the well-known steps. Thus, the MOS semiconductor device 101 is finished. A source electrode S and a drain electrode D shown in FIG. 3 schematically represent the aluminum contact hole and the aluminum wiring which are connected to the source-drain regions 8 and 9, respectively.

The oxide film and the nitride film which are formed in the above-mentioned manufacturing method can also be replaced with other insulating films. Moreover, a so-called LDD structure or extension structure may also be employed as a source/drain structure. In addition, a metal silicide film may be added to the source/drain regions 8 and 9. Furthermore, a polycide gate structure, a polymetal structure, a pure metal structure and the like can also be employed for the gate electrode 4.

As described above, the gate insulating film 3 is formed as an oxide film by using the thermal oxidation, for example. In the thermal oxidation, however, a growth speed of the oxide film has anisotropy because of a crystal surface orientation in the surface of the silicon substrate. In some cases, therefore, the thickness of the gate insulating film 3 is varied between the upper and side surfaces of the channel region 5. On the other hand, if the gate insulating film 3 is formed by using thin film deposition such as CVD or sputtering, the nonuniformity of the thickness of the film can be eliminated. Moreover, it is apparent that the gate insulating film 3 may be formed of a material other than the silicon oxide film, for example, a silicon nitride film.

Second Embodiment

Figure 18:
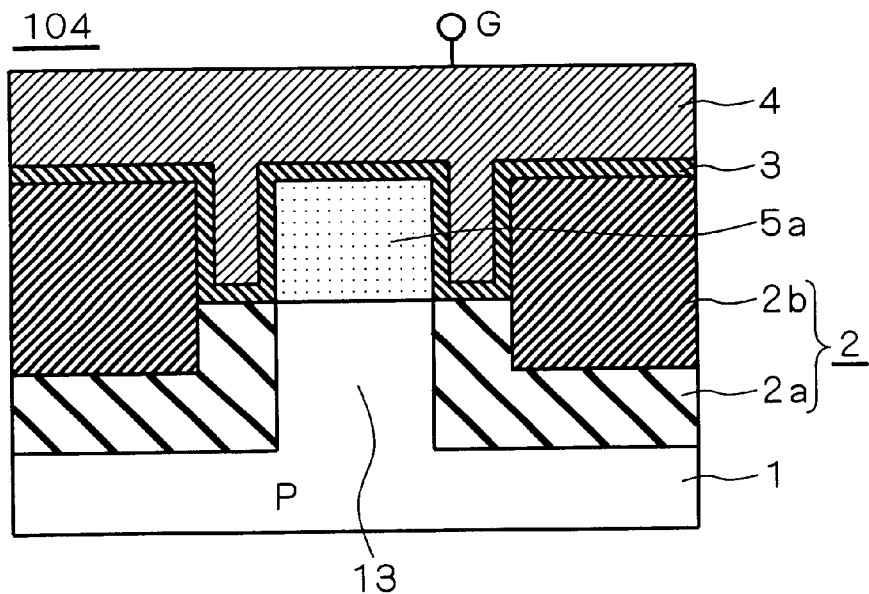
FIG. 18 is a sectional view showing a device according to a second embodiment.

FIG. 18 is a sectional view showing a MOS semiconductor device according to a second embodiment. In the device 104, an isolating film 2 has a first insulating material 2a and a second insulating material 2b different from each other. Only the first isolating film 2a is formed in a first portion where a trench is to be formed adjacently to a pair of side surfaces of a channel region 5 and the first isolating film 2a and the second isolating film 2b are formed in a second portion being another portion in the isolating film 2. The second isolating film 2b is formed on the first isolating film 2a. Furthermore, a height of an upper surface of the isolating film 2 is smaller than that of an upper surface of a semiconductor layer 13 in the first portion and is almost equal to that of the upper surface of the semiconductor layer 13 in the second portion.

A gate electrode 4 is formed across the channel region 5 and the first and second portions of the isolating film 2. Consequently, a portion between the gate electrode 4 and a main surface of the semiconductor substrate 1 which is not protruded is insulated from each other through the isolating film 2 in the same manner as in the device 101 of FIG. 2. As a result, the gate electrode 4 can cover the side surfaces of the channel region 5 while reducing a parasitic capacitance between the gate electrode 4 and a main surface of the semiconductor substrate 1.

The first isolating film 2a is formed as a silicon nitride film having a thickness of approximately 50 nm, for example, and the second isolating film 2b is formed as a silicon oxide film having a thickness of approximately 250 nm, for example. An upper surface of the first isolating film 2a in the first portion is set to be lower than that of the semiconductor layer 13 by approximately 300 nm.

Figure 19:
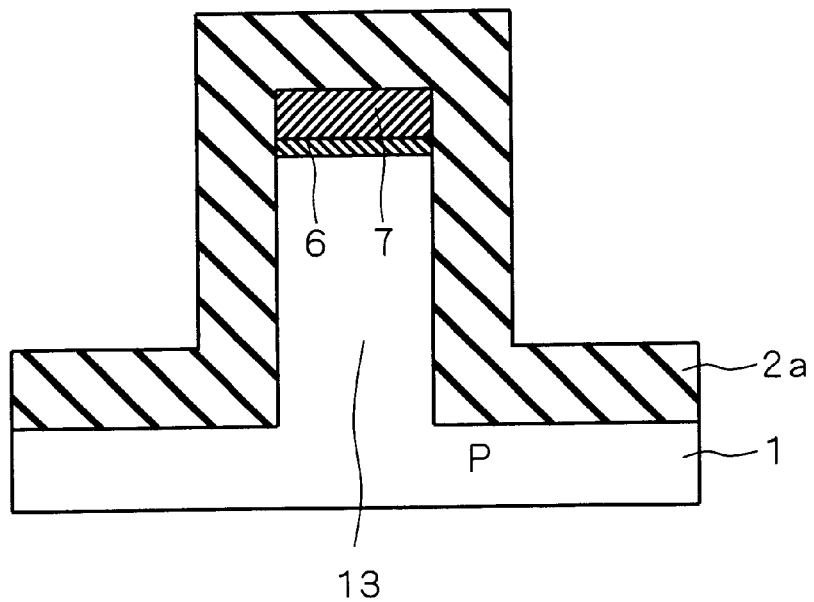
FIGS. 19 to 23 are views showing a manufacturing process for a manufacturing method according to the second embodiment.
Figure 20:
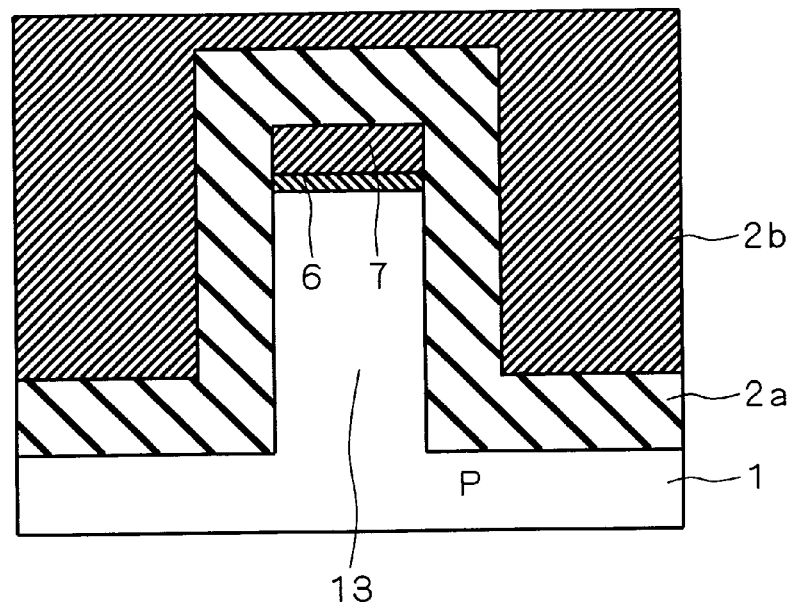

FIGS. 19 to 23 are views showing a manufacturing process for a preferred method of manufacturing the device 104. In order to manufacture the device 104, first of all, a silicon nitride film to be the first isolating film 2a is deposited in a thickness of approximately 50 nm on a surface of the intermediate structure formed at the step of FIG. 7 by using LP-CVD, for example (FIG. 19). Then, a silicon oxide film to be the second isolating film 2b completely fills up a trench of the semiconductor substrate 1 by using HDP-CVD, for example, and is further deposited to cover the first isolating film 2a portion covering the semiconductor layer 13 (FIG. 20).

Figure 21:
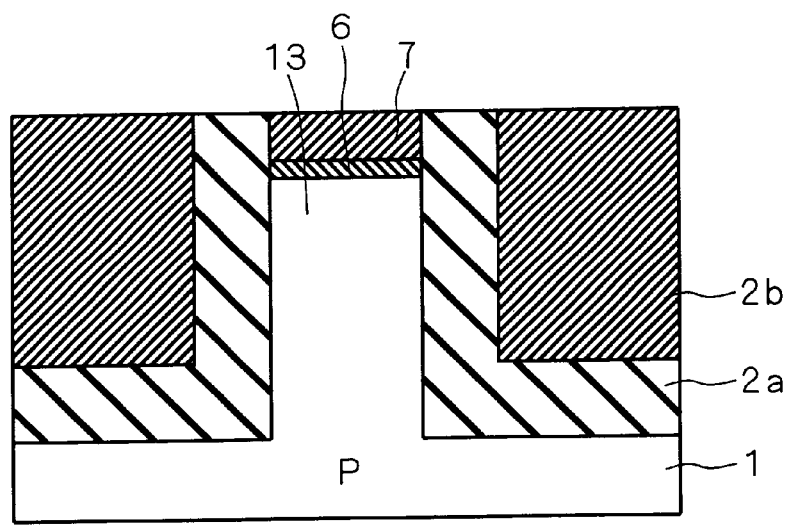
Figure 22:
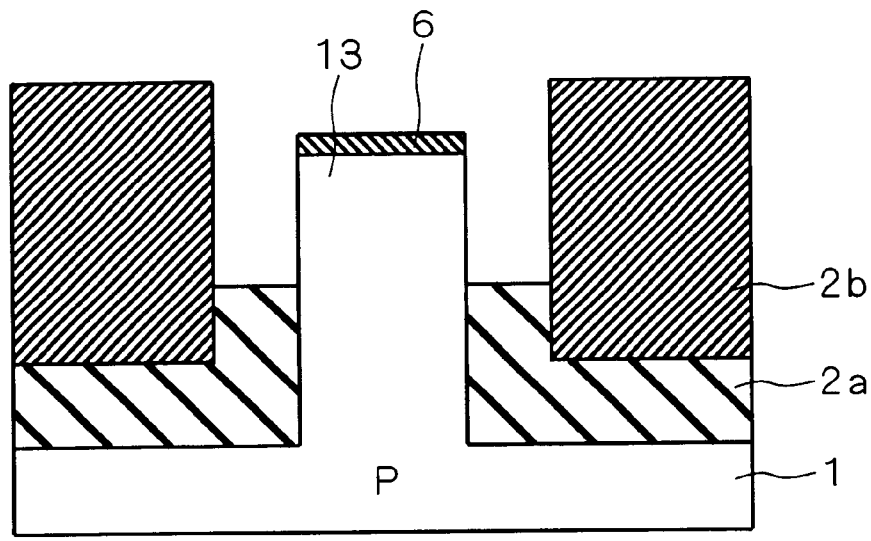

Next, a composite film including the first isolating film 2a and the second isolating film 2b is removed by CMP until an upper surface of a mask nitride film 7 is exposed (FIG. 21). Then, the mask nitride film 7 and the first isolating film 2a are removed by etching using thermal phosphoric acid as an etchant. At this time, a processing time is adjusted so that the upper surface of the first isolating film 2a in the first portion is lower than that of the semiconductor layer 13 by approximately 200 nm (FIG. 22). Also in this case, an opening of a resist pattern may be utilized to carry out local removal as described in the first embodiment.

Figure 23:
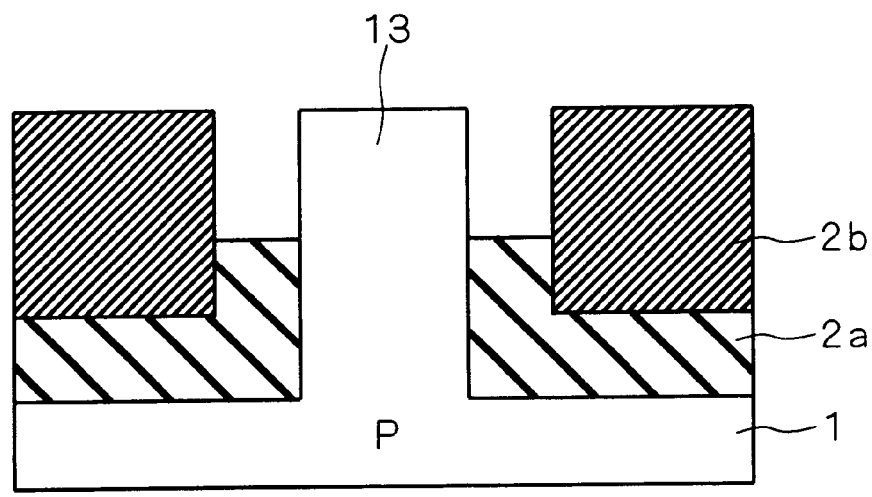

Subsequently, a substrate oxide film 6 is removed by etching using hydrofluoric acid and a thickness of the second isolating film 2b is reduced such that the upper surface of the second isolating film 2b is almost on a level with that of the semiconductor layer 13 (FIG. 23). Then, the steps shown in FIGS. 15 to 17 are carried out and the device 104 shown in FIG. 18 is finished.

According to the manufacturing method of the present embodiment, a range in which the isolating film 2 recedes in the first portion is automatically limited to be almost equal to the thickness of the second isolating film 2b. Accordingly, it is possible to prevent, with high controllability, a deterioration in an isolation characteristic of the isolating film 2. Furthermore, since the thickness of the first portion is restricted to that of the first isolating film 2a, a receding surface of the isolating film 2 is formed in self-alignment without a mask pattern defining the opening 12 in FIG. 11.

A nitride and an oxide may be reversely used for materials of the first isolating film 2a and the second isolating film 2b or materials other than the nitride and the oxide may be used. Moreover, it is also possible to employ a so-called LDD structure or extension structure as a source/drain structure. In addition, a metal silicide film may be added to the source/drain regions 8 and 9. Furthermore, a polycide gate structure, a polymetal structure, a pure metal structure and the like can also be employed for the gate electrode 4. The gate insulating film 3 may be formed by using thin film deposition such as CVD or sputtering.

Third Embodiment

FIG. 24 is a plan view showing a MOS semiconductor device according to a third embodiment. FIG. 25 is a sectional view showing the device which is taken along the line F—F in FIG. 24. In the device 105, a channel region is divided into a plurality of unit channel regions 5 (having the same reference numeral as that of the whole channel region) which are arranged in a direction of a channel width W. A part of a pair of side surfaces and an upper surface in each of the unit channel regions 5 are covered by a gate electrode 4 with a gate insulating film 3 interposed therebetween. Consequently, an effective channel width is increased. Thus, it is possible to suppress a short channel effect and to increase a current capacity.

Moreover, a height of an upper surface of an isolating film 2 is set to be almost equal to that of an upper surface of a semiconductor layer 13 in a region provided apart from ends of the unit channel regions 5 which are arranged. Consequently, the same advantages as those of the device 101 in FIG. 2 can be obtained.

Preferably, the channel width W of each of the unit channel regions 5 is set to be equal to or smaller than a double of a maximum channel depletion layer width Xdm. Thereby, a short channel effect can be suppressed effectively.

The gate electrode 4 insulated by the gate insulating film 3 should be interposed between the unit channel regions 5. Accordingly, a space between the unit channel regions 5 should be set to be larger than a double of a thickness of the gate insulating film 3. With such a structure, there is no possibility that an area of the device occupying the semiconductor substrate 1 might be more increased than the conventional MOS semiconductor device having the same current capacity. The reason is that an inversion layer is formed on side surfaces as well as an upper surface in the divided unit channel region 5. More specifically, an effective channel width of the unit channel region 5 is the sum of a geometrical channel width W and a double of a width D of the gate electrode 4 opposed to the side surface (which will be hereinafter referred to as a side wall gate width). If the side wall gate width D is set to be large (that is, the side wall is set to have a large depth), the area of the device can be set to be smaller than that of the conventional device having the same current capacity. In other words, it is possible to obtain a MOS semiconductor device having a higher current driving capability than that of the conventional device.

Figure 26:
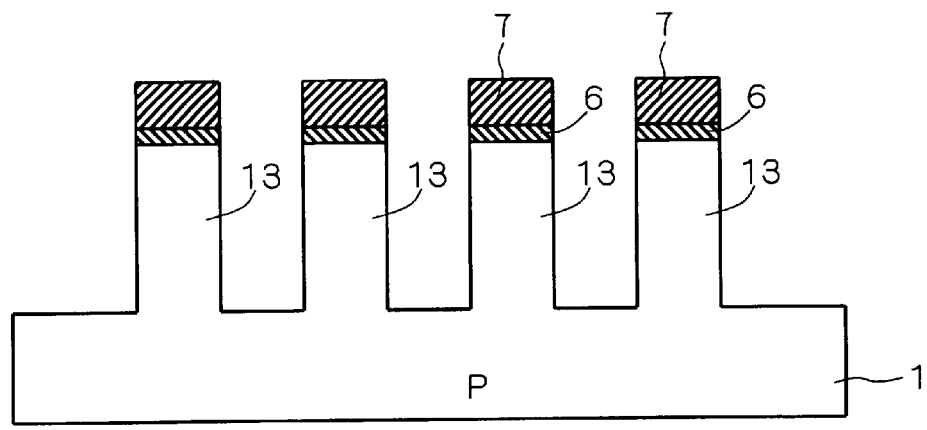
FIGS. 26 and 27 are views showing a manufacturing process for a manufacturing method according to the third embodiment.
Figure 27:
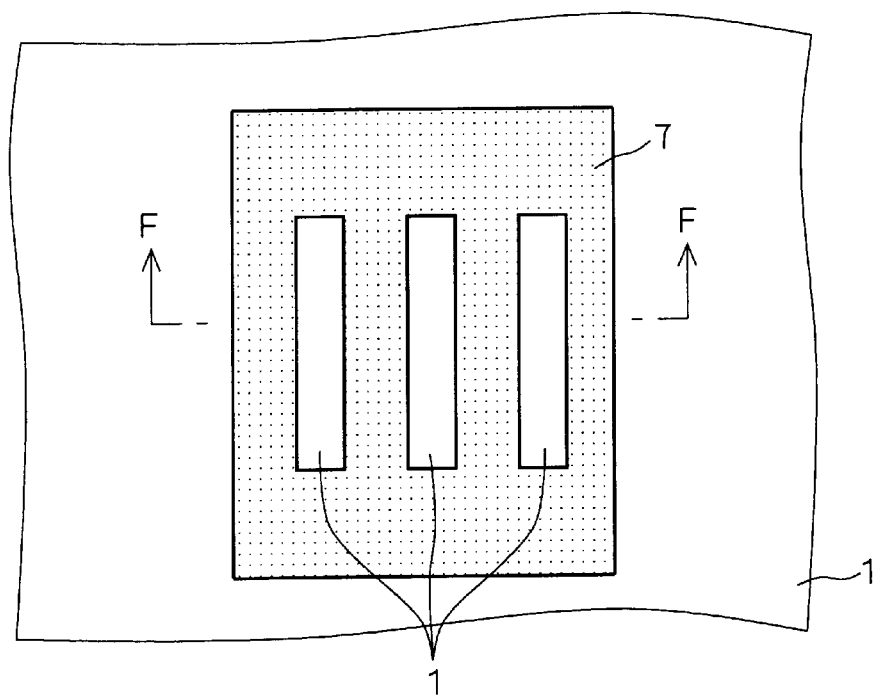

In order to manufacture the device 105, a partial region of the semiconductor layer 13 which is to be the channel region 5 is formed to be divided into a plurality of unit regions arranged in a direction of a channel width after the step of FIG. 6 as shown in FIGS. 26 and 27. For this purpose, it is preferable that a substrate oxide film 6 and a mask nitride film 7 should be subjected to patterning such that the partial region is divided into a plurality of unit regions. Preferably, a width corresponding to the channel width of each unit region is set to be equal to or smaller than a double of the maximum channel depletion layer width Xdm. FIG. 26 is a sectional view taken along the line F—F in a plan view of FIG. 27. A position of the line F—F in FIG. 27 corresponds to the position of the line F—F in FIG. 24. Through these steps, the gate insulating film 3 is formed to cover a part of a pair of side surfaces and an upper surface in each of the unit regions, and the gate electrode 4 is formed to cover the gate insulating film 3.

Fourth Embodiment

Figure 28:
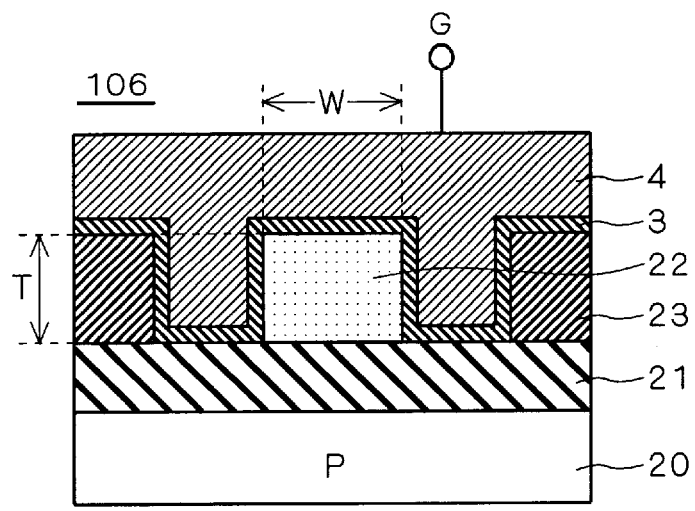
FIG. 28 is a sectional view showing a device according to a fourth embodiment.

In a fourth embodiment, description will be given to a MOS semiconductor device utilizing an SOI substrate. FIG. 28 is a sectional view showing the MOS semiconductor device according to the fourth embodiment. In the device 106, a buried oxide film as an insulating layer 21 is formed on a silicon substrate as a support substrate 20, and a silicon layer as an SOI layer 22 is formed on the insulating layer 21. The SOI layer 22 has been removed leaving only a semiconductor layer where a channel region 5 and source-drain regions 8 and 9 are formed.

An isolating film 23 is selectively formed on the insulating layer 21 to surround the semiconductor layer. Moreover, a portion of an upper surface of the insulating layer 21 which is adjacent to a pair of side surfaces of the channel region 5 (the SOI layer 22 shown in FIG. 28) is not covered by the isolating film 23 but by a gate electrode 4. More specifically, the isolating film 23 is formed to surround the semiconductor layer leaving a trench which is adjacent to the side surfaces of the channel region 5 and reaches the insulating layer 21.

Consequently, the gate electrode 4 covers almost the whole side surfaces as well as an upper surface of the channel region 5 with a gate insulating film 3 interposed therebetween. Therefore, a short channel effect can be suppressed more considerably. Preferably, a channel width W is set to be equal to or smaller than a double of a maximum depletion layer width Xdm.

An upper surface of the isolating film 23 is almost on a level with that of the semiconductor layer. Accordingly, the same effects as those in the device 101 of FIG. 2 can be obtained.

Usually, a mode of a transistor formed in the SOI substrate is classified into two types based on a relationship between a thickness of a depletion layer in a direction perpendicular to the substrate and a thickness of the SOI layer. In a partial depletion type, the thickness of the SOI layer is larger than that of the depletion layer. In a complete depletion type, the thickness of the depletion layer is larger than that of the SOI layer. The device 106 can be applied to both of the modes. In the partial depletion type, a thickness T of the SOI layer is set to be larger. Therefore, a side wall gate width (D in FIG. 25) is increased. Thus, it is possible to obtain an advantage that a current driving capability can be enhanced more highly than that in the complete depletion type.

Figure 29:
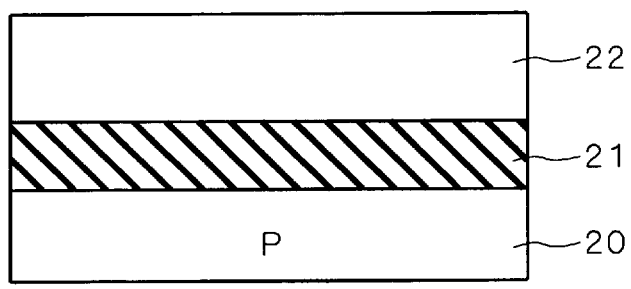
FIGS. 29 to 33 are views showing a manufacturing process for a manufacturing method according to the fourth embodiment.

FIGS. 29 to 33 are views showing a manufacturing process for a preferred method of manufacturing the device 106. In order to manufacture the device 106, first of all, an SOI substrate including a support substrate 20, an insulating layer 21 and an SOI layer 22 is prepared (FIG. 29). The SOI layer 22 is formed as a P-type silicon layer having a thickness of approximately 100 nm, for example.

Figure 30:
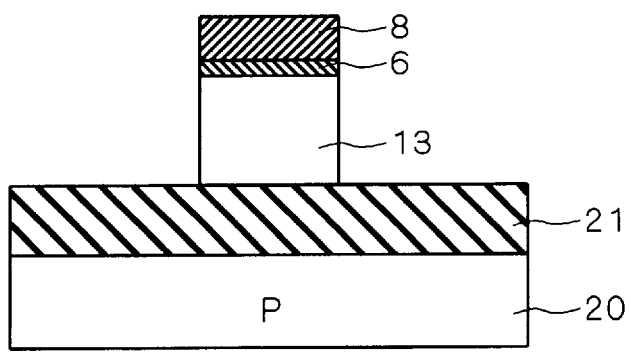
Figure 31:
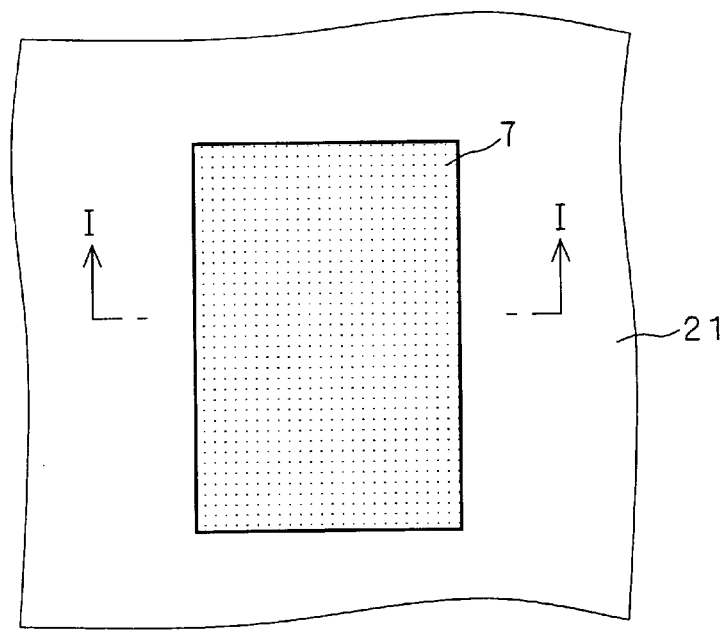

In the same manner as in FIG. 7, next, the SOI layer 22 is subjected to selective etching by using, as shields, a substrate oxide film 6 and a mask nitride film 7 which are patterned utilizing lithography and the SOI layer 22 portion other than a portion provided under the substrate oxide film 6 and the mask nitride film 7 is removed (FIGS. 30 and 31). Consequently, it is possible to obtain such a structure that a main surface of the SOI layer 22 selectively recedes until the insulating layer 21 is exposed and a semiconductor layer 13 is selectively protruded upward from the receding main surface. For example, an anisotropic plasma etching technique is used for the selective etching. FIG. 30 is a sectional view taken along the line I—I in a plan view of FIG. 31.

Figure 32:
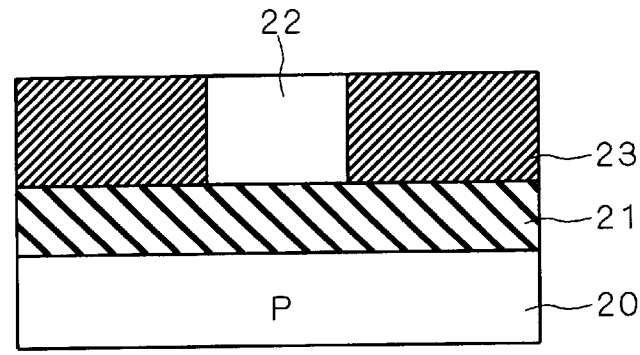
Figure 33:
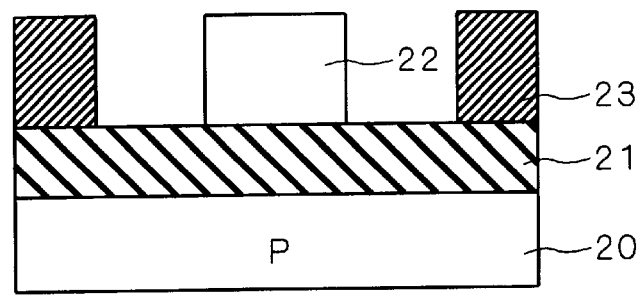

In order to cover the semiconductor layer 13, subsequently, an oxide film to be an isolating film 23 is deposited on an intermediate structure obtained after the step of FIG. 30. Then, upper surfaces of the isolating film 23 and the semiconductor layer 13 are flattened by using CMP (FIG. 32). Next, the same steps as those in FIGS. 11 to 14 are carried out so that the isolating film 23 is removed until the insulating layer 21 is exposed in a portion which is adjacent to a pair of side surfaces of a partial region of the semiconductor layer 13 to be the channel region 5 (FIG. 33). For example, chemical etching is used for the removal of the isolating film 23. Thereafter, the same steps as those in FIGS. 15 to 17 are carried out so that the device 106 can be obtained.

Another Example of Fourth Embodiment

Figure 34:
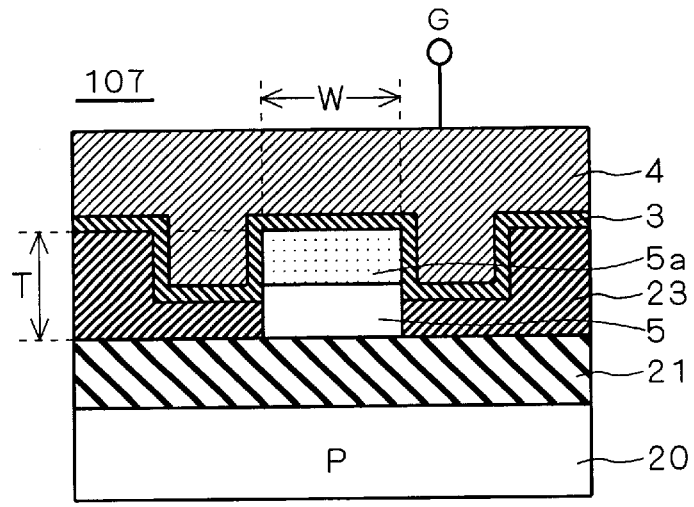
FIG. 34 is a sectional view showing a device according to another example of the fourth embodiment.

FIG. 34 is a sectional view showing a device according to another example of the present embodiment. In the device 107, an isolating film 23 is formed in the same manner as the isolating film 2 of the device 101 in FIG. 2. More specifically, the isolating film 23 remains in such a configuration that an upper surface thereof recedes downward from that of a channel region 5 also in a portion adjacent to the channel region 5. Accordingly, a gate electrode 4 does not cover a pair of side surfaces of the channel region 5 almost wholly but covers a part thereof. As a result, a channel depletion layer 5a is not enlarged over the whole channel region 5 and a neutral region which is neither inverted nor depleted remains in a lower part of the channel region 5.

Figure 35:
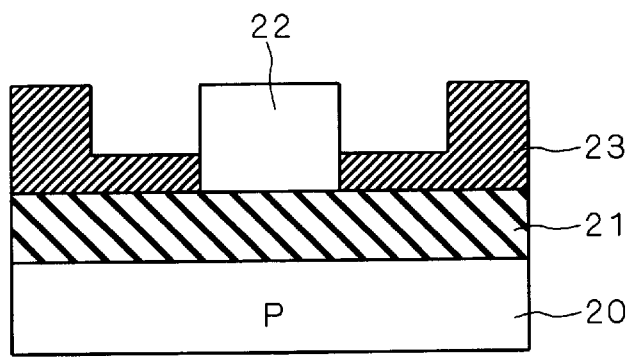
FIG. 35 is a view showing a manufacturing process for a manufacturing method according to another example of the fourth embodiment.

In order to manufacture the device 107, it is preferable that selective removal of the isolating film 23 should be stopped before an insulating layer 21 is exposed when the same steps as those of FIGS. 11 to 14 are executed after the step of FIG. 32 for manufacturing the device 106 (FIG. 35). Then, the same steps as those in FIGS. 15 to 17 are carried out so that the device 107 can be obtained.

Further Example of Fourth Embodiment

Figure 36:
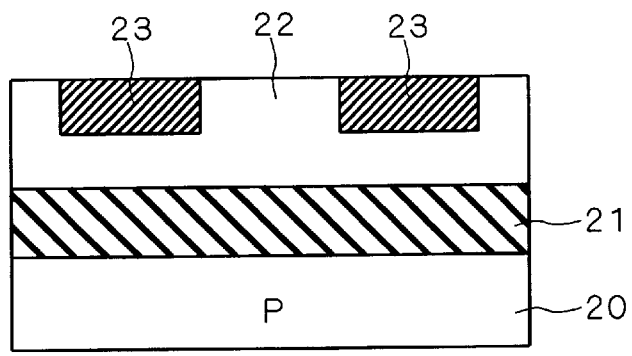
FIG. 36 is a view showing a manufacturing process for a manufacturing method according to a further example of the fourth embodiment.

At the step of FIG. 30 for manufacturing the device 106, the SOI layer 22 is not removed until the insulating layer 21 is exposed but until it has a thickness which is approximately 1/X (X=1 to 5) of an original thickness of the SOI layer 22, for example. Thus, it is also possible to form the isolating film 23 with a partial trench isolation structure as shown in FIG. 36. This is equivalent to that the isolating film 2 formed on the main surface of the semiconductor substrate 1 in the first embodiment is applied to a main surface of the SOI layer 22.

Moreover, the isolating film 2 having a two-layer structure described in the second embodiment can also be applied to the SOI layer 22. In the same manner as in the third embodiment, furthermore, the channel region 5 formed in the SOI layer 22 can also be divided into a plurality of unit channel regions 5.

Fifth Embodiment

Figure 37:
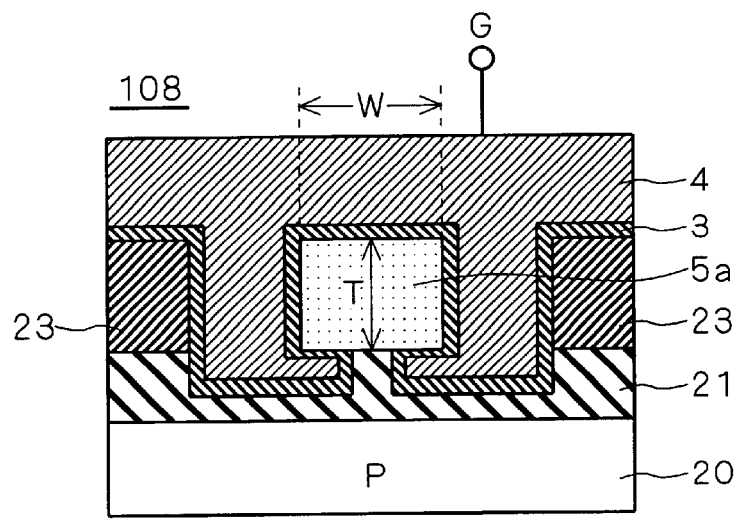
FIG. 37 is a sectional view showing a device according to a fifth embodiment.

FIG. 37 is a sectional view showing a MOS semiconductor device according to a fifth embodiment. In the device 108, a gate electrode 4 is opposed to a part of a bottom surface of a channel region 5 as well as an upper surface and side surfaces thereof with a gate insulating film 3 interposed therebetween. Consequently, a charge share ratio of the gate electrode 4 is further increased. Therefore, a short channel effect for a threshold voltage can further be suppressed. Moreover, since an effective channel width is increased, a high current driving capability can be obtained.

Although the whole channel region 5 can be covered by the gate electrode 4 (which will be presented in a seventh embodiment), it would cause the channel region 5 to temporality float in the air in a manufacturing process and thereby arise a possible strength problem. In this respect, the channel region 5 is always coupled to an insulating layer 21 in the configuration shown in FIG. 37 throughout the manufacturing process. Therefore, the strength can be increased. As a result, it is possible to obtain an advantage that manufacturing yield can be enhanced. For example, approximately a quarter of a width of the bottom surface of the channel region 5 (which is coincident with a channel width W) is coupled to the insulating layer 21.

Figure 38:
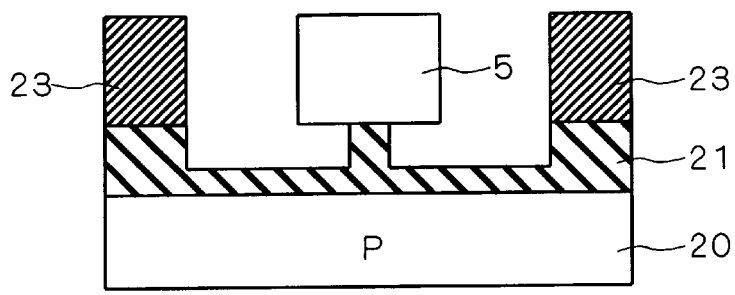
FIG. 38 is a view showing a manufacturing process for a manufacturing method according to the firth embodiment.

In order to manufacture the device 108, for example, it is preferable that a surface portion of an oxide film to be the insulating layer 21 should be selectively removed through wet etching using a hydrofluoric acid solution as an etchant after the step of FIG. 33 for manufacturing the device 106, for example (FIG. 38). At this time, an SOI layer 22 and an isolating film 23 which remain function as shields. Then, the same steps as those of FIGS. 15 to 17 are carried out so that the device 108 can be obtained.

Sixth Embodiment

The Damascene gate method has recently been proposed as a method of manufacturing a gate electrode of a MOS transistor. The gate electrode 4 covering the channel region 5 can be formed in self-alignment by a combination of the present invention with the Damascene technique. In the present embodiment, such a manufacturing method will be described with reference to the steps shown in FIGS. 39 to 46.

Figure 39:
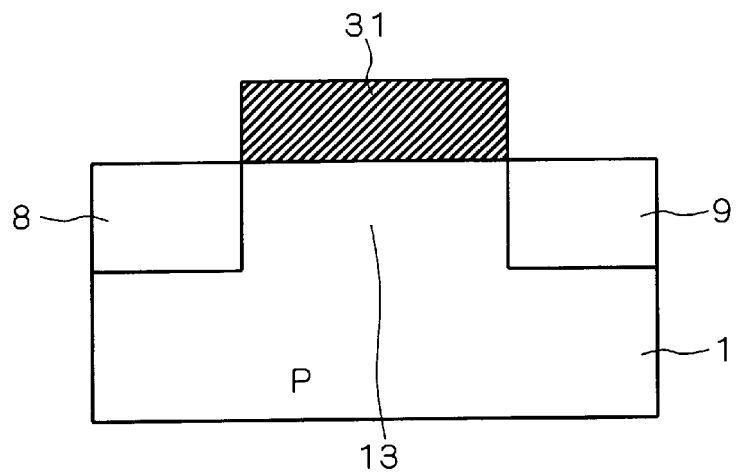
FIGS. 39 to 46 are views showing a manufacturing process for a manufacturing method according to a sixth embodiment.
Figure 40:
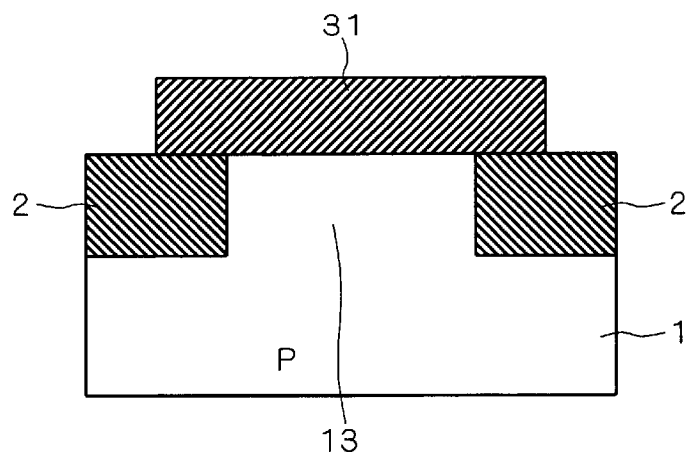

In the manufacturing method, first of all, a substrate oxide film 6 and a mask nitride film 7 are removed after the steps of FIGS. 6 to 10 are executed. Then, the steps of FIGS. 39 and 40 are executed. FIGS. 39 and 40 are sectional views showing an intermediate structure obtained in the middle of the manufacturing steps, which are taken along the lines B—B and A—A of FIG. 1.

At the steps of FIGS. 39 and 40, first of all, a silicon oxide film as a sacrificial layer 31 having a thickness of approximately 200 nm is deposited over the whole surface of the intermediate structure by LP-CVD. Then, the sacrificial layer 31 is patterned by using lithography and etching to have the same position and size as those of the gate electrode 4. Next, the sacrificial layer 31 is used as a shield to implant arsenic to be an N-type impurity at a density of $1 \times 10^{15}$ cm$^{-2}$ and to further apply annealing at 900° C. Consequently, source/drain regions 8 and 9 are formed.

Figure 41:
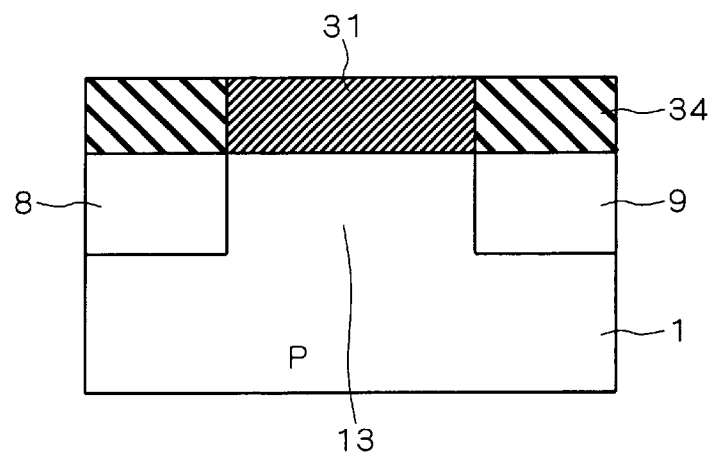
Figure 42:
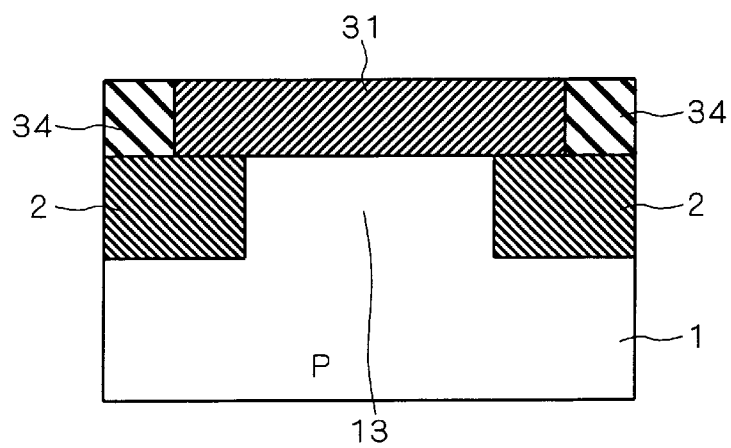
Figure 43:
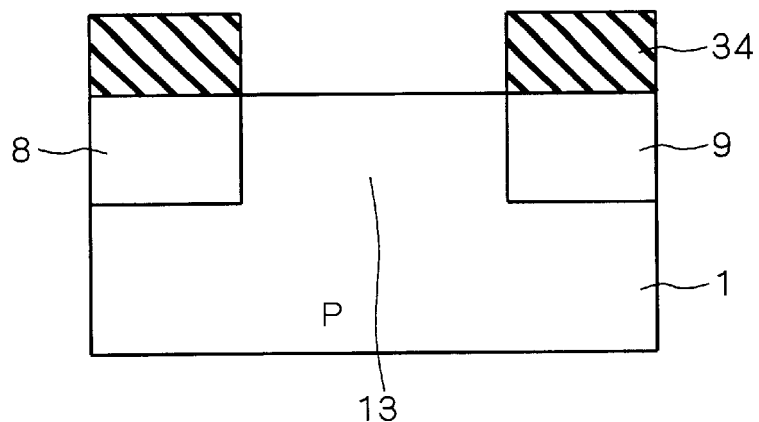

At the steps of FIG. 41 (B—B sectional view) and FIG. 42 (A—A sectional view), a silicon nitride film 34 is deposited in a thickness of approximately 200 nm on an upper surface of the intermediate structure by CVD until the sacrificial layer 31 is covered. Then, the silicon nitride film 34 is removed by CMP until an upper surface of the sacrificial layer 31 is exposed. At the step of FIG. 43 (B—B sectional view), etching is carried out by using a hydrofluoric acid solution as an etchant. Consequently, the whole sacrificial layer 31 is removed. Thus, the silicon nitride film 34 is formed as a mold.

Figure 44:
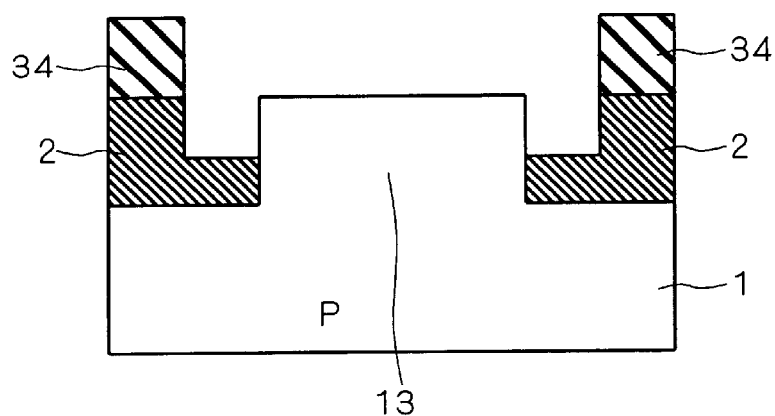

At the step of FIG. 44 (A—A sectional view), a part of an isolating film 2 is selectively removed to have a smaller thickness through etching using the hydrofluoric acid solution. At this time, the silicon nitride film 34 functions as a shield. Therefore, a region covered by the sacrificial layer 31, that is, only a portion covered by the gate electrode 4 at a subsequent step is subjected to etching. More specifically, a receding surface of the isolating film 2 in which the gate electrode 4 is buried is formed in self-alignment without using a mask pattern requiring alignment.

Differently from the case in which the resist pattern having the opening 12 shown in FIG. 11 is used, accordingly, a difference in a height is generated in only a gate electrode region in a boundary line between an upper surface of a semiconductor layer 13 and that of the isolating film 2. Consequently, it is possible to eliminate drawbacks that a margin of a focal depth is deteriorated by a useless difference in a height in the lithography or a residue of a polysilicon film as an etching film is easily generated on the useless difference in a height during an anisotropic etching processing.

Figure 45:
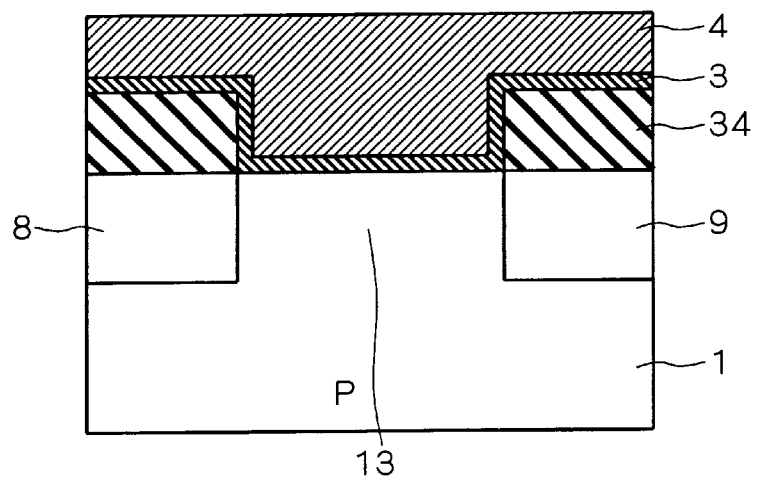
Figure 46:
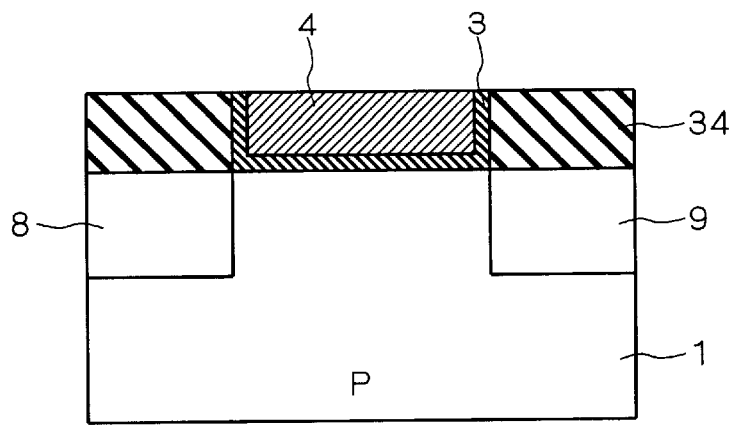

At the step of FIG. 45 (B—B sectional view), an oxide film having a thickness of approximately 5 nm is formed as a gate insulating film 3 on the surface of the intermediate structure by thermal oxidation, and an N-type polysilicon film as a material of the gate electrode 4 is further deposited in a thickness of approximately 300 nm on the gate insulating film 3 by LP-CVD. At the step of FIG. 46 (B—B sectional view), the polysilicon film is removed by CMP until an upper surface of the silicon nitride film 34 is exposed. As a result, the gate electrode 4 is formed in the same region as the sacrificial layer 31 described above.

Then, a device having the same structure as that of the MOS semiconductor device 101 (FIG. 2) is finished through the formation of an interlayer insulating film, an aluminum contact hole and an aluminum wiring at the well-known steps.

The oxide film and nitride film formed in the above-mentioned manufacturing method can also be replaced with other insulating films. Moreover, it is also possible to employ a so-called LDD structure or extension structure as a source/drain structure. In addition, a metal silicide film may be added to the source/drain regions 8 and 9. Furthermore, it is also possible to employ a polycide gate structure, a polymetal structure, a pure metal structure and the like as the gate electrode 4. The gate insulating film 3 may also be formed by using a thin film depositing method such as CVD or sputtering. Moreover, an SOI substrate can also be used in place of the semiconductor substrate 1.

Seventh Embodiment

Figure 47:
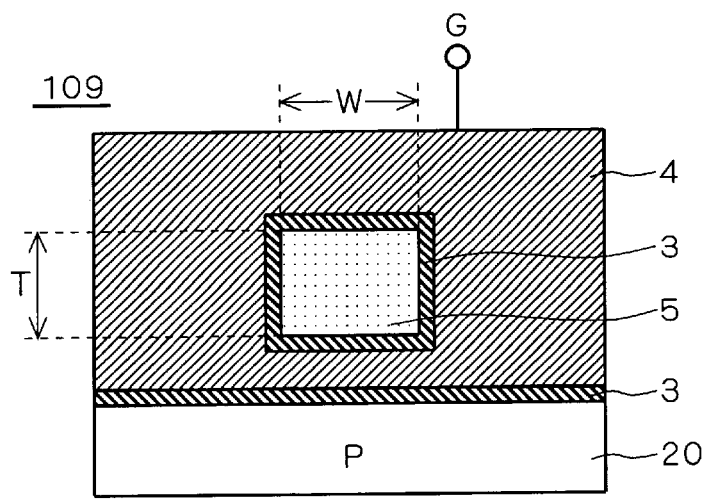
FIGS. 47 and 48 are sectional views showing a device according to a seventh embodiment.
Figure 48:
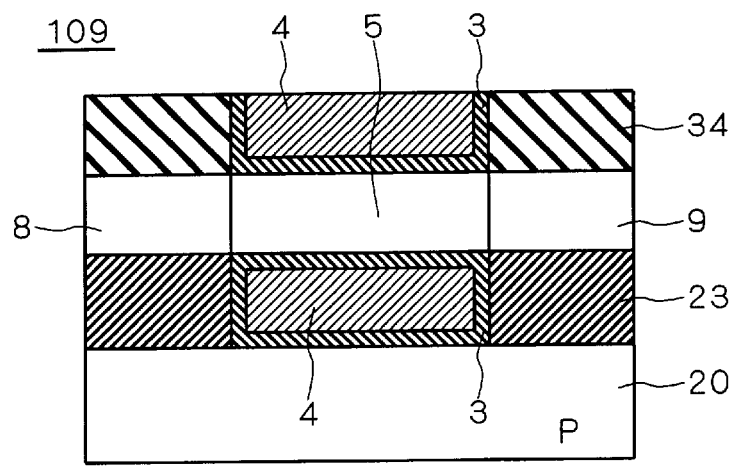

FIGS. 47 and 48 are sectional views showing a MOS semiconductor device according to a seventh embodiment. FIGS. 47 and 48 correspond to sectional views taken along the lines A—A and B—B when FIG. 1 is seen as a plan view showing the device according to the present embodiment, respectively. In a device 109, a channel region 5 floats above a receding main surface of an SOI substrate and all upper, side and bottom surfaces of the channel region 5 are covered by a gate electrode 4 with a gate insulating film 3 interposed therebetween. Consequently, a charge share ratio of the gate electrode 4 is further increased. Thus, it is possible to further suppress a short channel effect on a threshold voltage. Moreover, since an effective channel width is increased, a high current driving capability can be obtained.

In order to manufacture the device 109, it is preferable that a so-called gate all around structure should be implemented by utilizing the manufacturing method according to the sixth embodiment. Consequently, formation of source-drain regions 8 and 9 which requires annealing at a high temperature (for example, 900° C.) is carried out before the gate electrode 4 is formed. Therefore, it is possible to form a gate all around SOI transistor using an electrode material (for example, a metal or the like) having a low temperature resistance as the gate electrode 4.

More specifically, the steps of FIGS. 49 to 56 which will be described below are executed after the steps of FIGS. 29 to 32. The steps of FIGS. 49 to 52 are the same as those of FIGS. 39 to 42 described above except that a semiconductor substrate is an SOI substrate.

At the steps of FIGS. 49 and 50, first of all, a silicon oxide film as a sacrificial layer 31 having a thickness of approximately 200 nm is deposited by LP-CVD over the whole surface of the intermediate structure obtained after the step of FIG. 32. Then, the sacrificial layer 31 is patterned by using lithography and etching to have the same position and size as those of the gate electrode 4.

Next, the sacrificial layer 31 is used as a shield to implant arsenic to be an N-type impurity at a density of $1 \times 10^{15}$ cm$^{-2}$ and to further apply annealing at 900° C. Consequently, source/drain regions 8 and 9 are formed. FIGS. 49 and 50 correspond to sectional views taken along the lines B—B and A—A when FIG. 1 is seen as a plan view showing the intermediate structure at the step of manufacturing the device 109, respectively.

Figure 52:
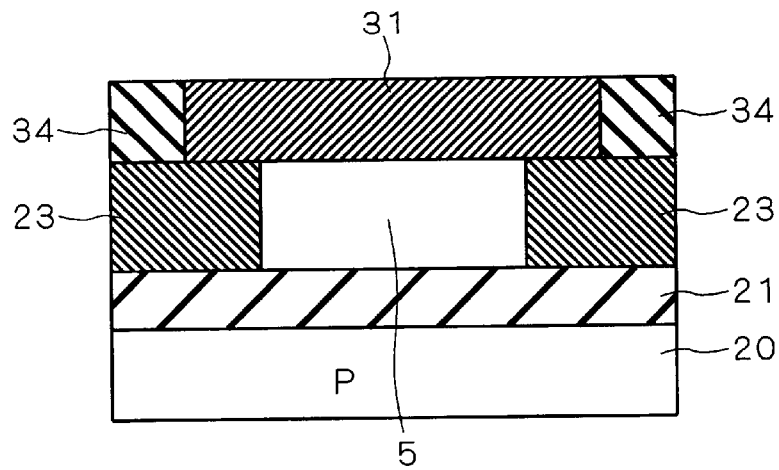

At the steps of FIG. 51 (B—B sectional view) and FIG. 52 (A—A sectional view), a silicon nitride film 34 is deposited in a thickness of approximately 200 nm on an upper surface of the intermediate structure by CVD until the sacrificial layer 31 is covered. Then, the silicon nitride film 34 is removed by CMP until an upper surface of the sacrificial layer 31 is exposed.

Figure 53:
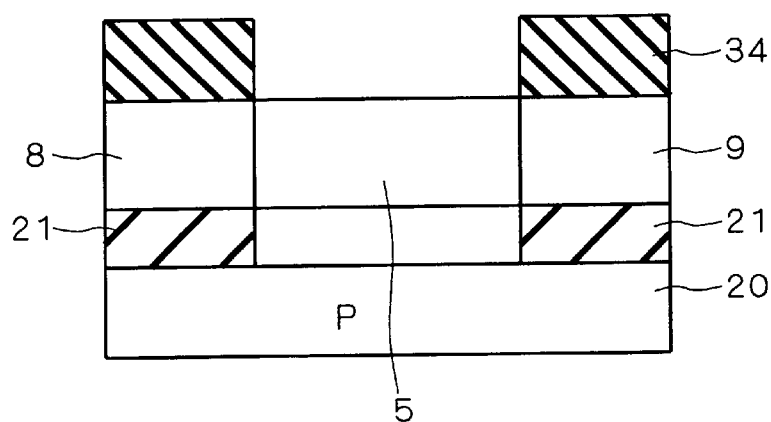
Figure 54:
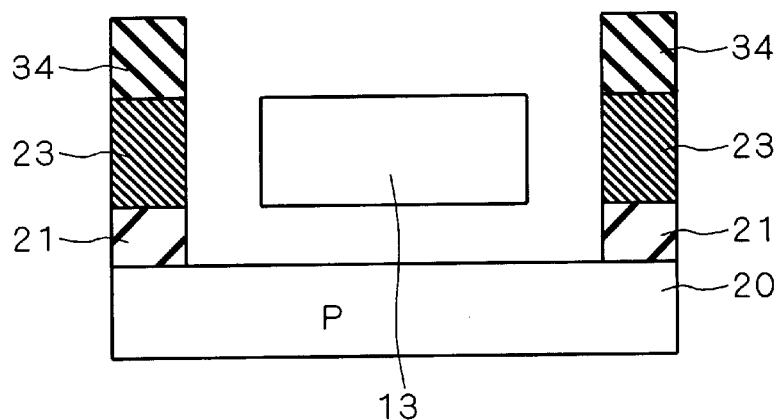

At the steps of FIG. 53 (B—B sectional view) and FIG. 54 (A—A sectional view), etching is carried out by using a hydrofluoric acid solution as an etchant. Consequently, the whole sacrificial layer 31 is removed. Thus, the silicon nitride film 34 is formed as a mold. At the same time, the silicon nitride film 34 functions as a shield. Consequently, portions of the isolating film 2 and the insulating film 21 which are positioned directly under the sacrificial layer 31 are removed. As a result, the channel region 5 completely floats above a support substrate 20.

Figure 55:
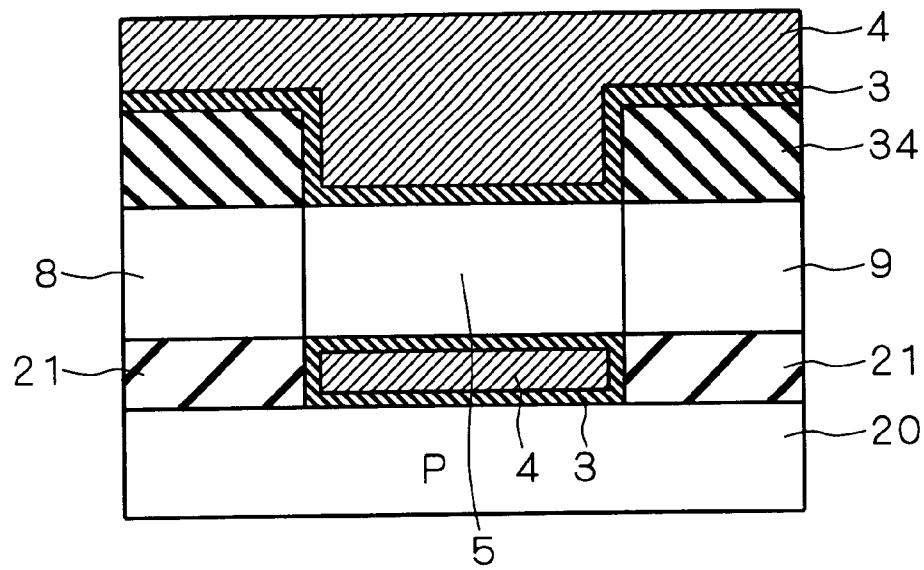
Figure 56:
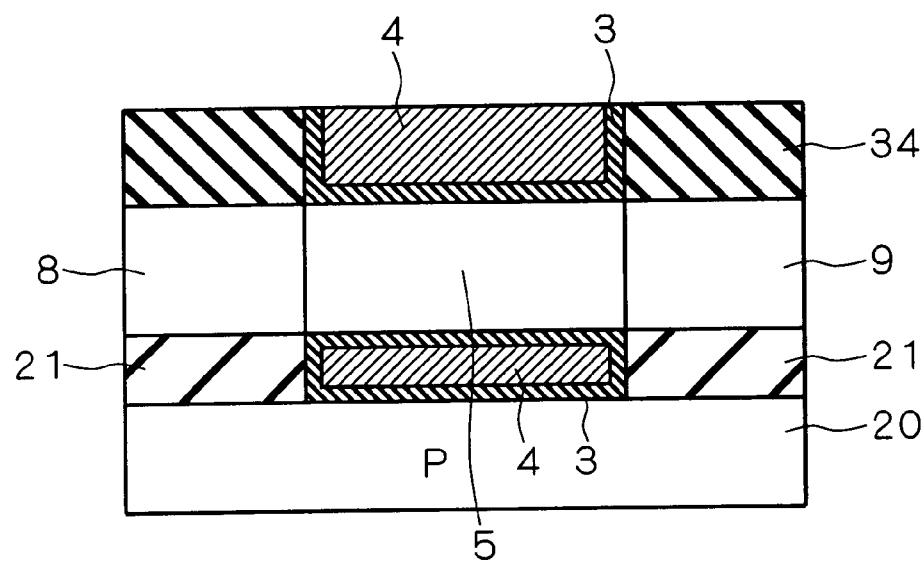

At the step of FIG. 55 (B—B sectional view), an oxide film having a thickness of approximately 5 nm is formed as a gate insulating film 3 on the surface of the intermediate structure by thermal oxidation, and an N-type polysilicon film as a material of the gate electrode 4 is deposited in a thickness of approximately 300 nm on the gate insulating film 3 by LP-CVD. At the step of FIG. 56 (B—B sectional view), the polysilicon film is removed by CMP until an upper surface of the silicon nitride film 34 is exposed. As a result, the gate electrode 4 is formed in the region where the sacrificial layer 31 is formed and a region provided directly under that.

Then, the MOS semiconductor device 109 (FIGS. 47 and 48) is finished through the formation of an interlayer insulating film, an aluminum contact hole and an aluminum wiring at the well-known steps.

In the method of manufacturing the device 109 described above, it is sufficient that a lithography step is carried out once. Therefore, it is possible to obtain an advantage that a portion of the gate electrode 4 positioned on the upper surface of the SOI layer and a portion positioned lower than the upper surface of the SOI layer can be aligned in self-alignment. Accordingly, the gate electrode 4 does not overlap with the source-drain regions 8 and 9. Consequently, an increase in a speed of an operation of the device can be promoted. Furthermore, a deviation in a characteristic of the device as a product can be reduced.

The oxide film and nitride film formed in the method of manufacturing the device 109 described above can also be replaced with other insulating films. Moreover, it is also possible to employ a so-called LDD structure or extension structure as a source/drain structure. In addition, a metal silicide film may be added to the source/drain regions 8 and 9. Furthermore, it is also possible to employ a polycide gate structure, a polymetal structure, a pure metal structure and the like as the gate electrode 4. A composite film structure thereof can also be employed as the gate electrode 4. Moreover, the gate insulating film 3 may also be formed by using a thin film depositing method such as CVD or sputtering.

Eighth Embodiment

FIG. 57 is a longitudinal sectional view showing the MOS semiconductor device 101 according to the first embodiment and FIG. 58 is a plan view showing the same. FIG. 57 corresponds to a sectional view showing the device taken along the line A—A in FIG. 58. As shown in FIG. 57, a difference (provisionally referred to as an "upper surface step") h between a height of an upper surface of an isolating film 2 and that of an upper surface of a semiconductor layer 13 (that is, an upper surface of a channel region 5) brings a step (provisionally referred to as a "gate upper surface step") H on an upper surface of a gate electrode 4 formed to cover them. If the gate upper surface step H is large, a thinned portion d is generated in a portion where the step is made as shown in FIG. 58 at the step of patterning a material of a gate electrode by lithography to form the gate electrode 4. It is supposed that the thinned portion d is generated due to a halation caused on irradiated light for exposure in a portion where the step is formed. If the thinned portion d is large to exceed a certain limit, an operation of the semiconductor device 101 is affected. Moreover, if the gate upper surface step H is larger than a focal depth of an irradiation light lens to be used for the lithography, a width of a portion in the gate electrode 4 which covers the semiconductor layer 13 might be affected.

Figure 59:
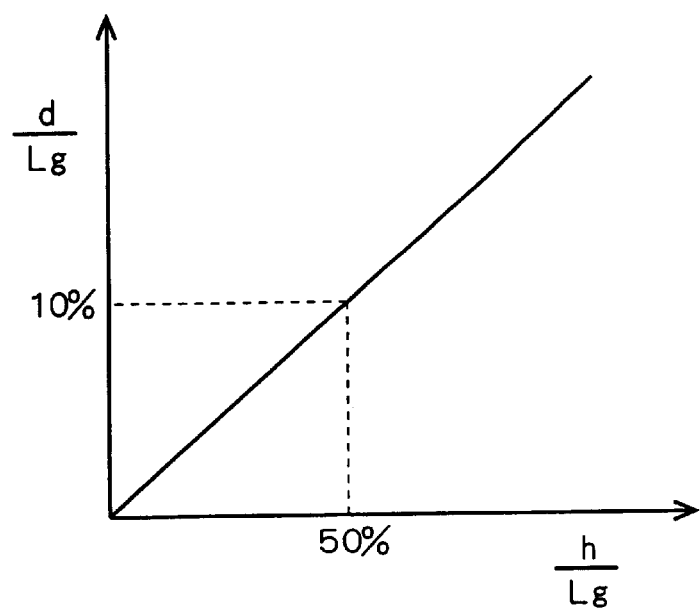
FIG. 59 is a chart related to the device according to the eighth embodiment.
Figure 60:
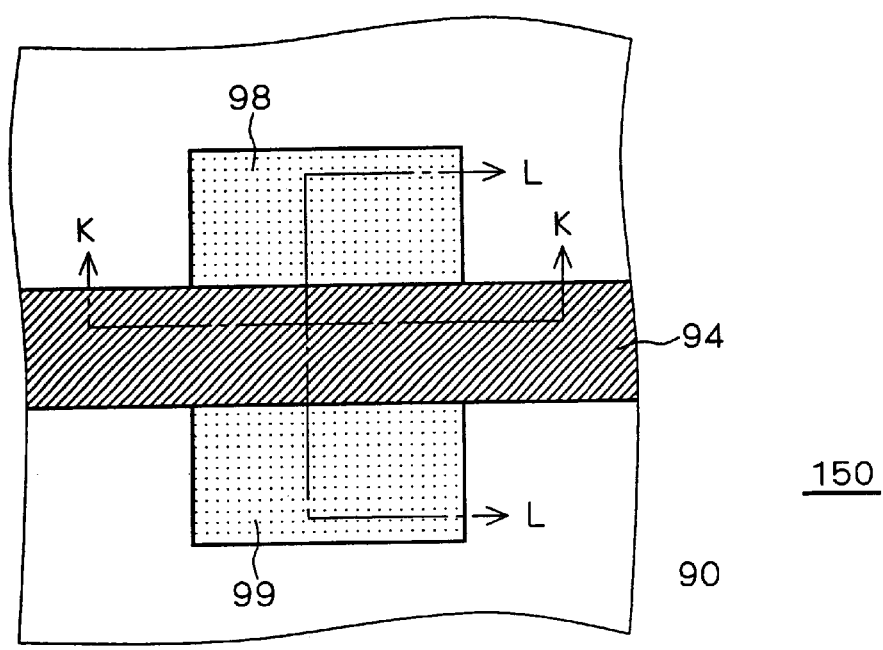
FIG. 60 is a plan view showing a conventional device.
Figure 61:
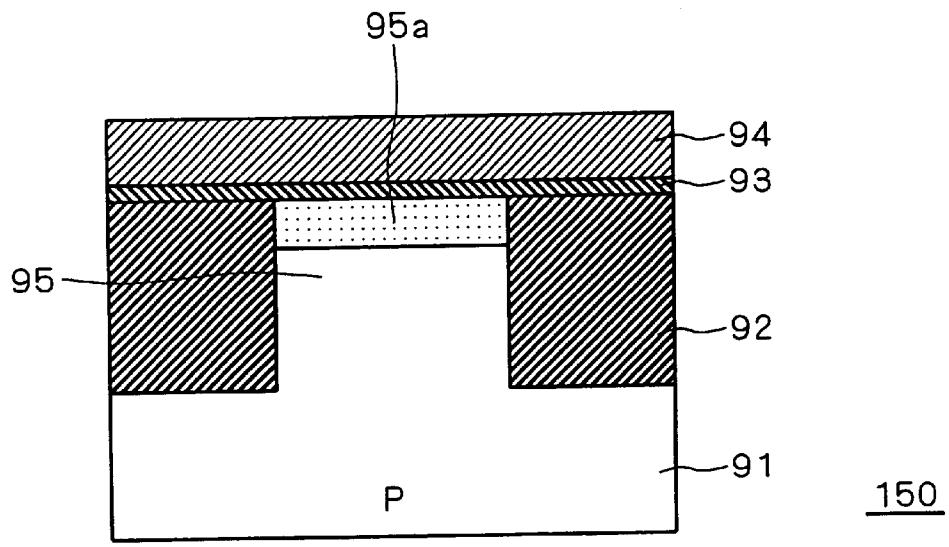
FIGS. 61 and 62 are sectional views showing the conventional device.
Figure 62:
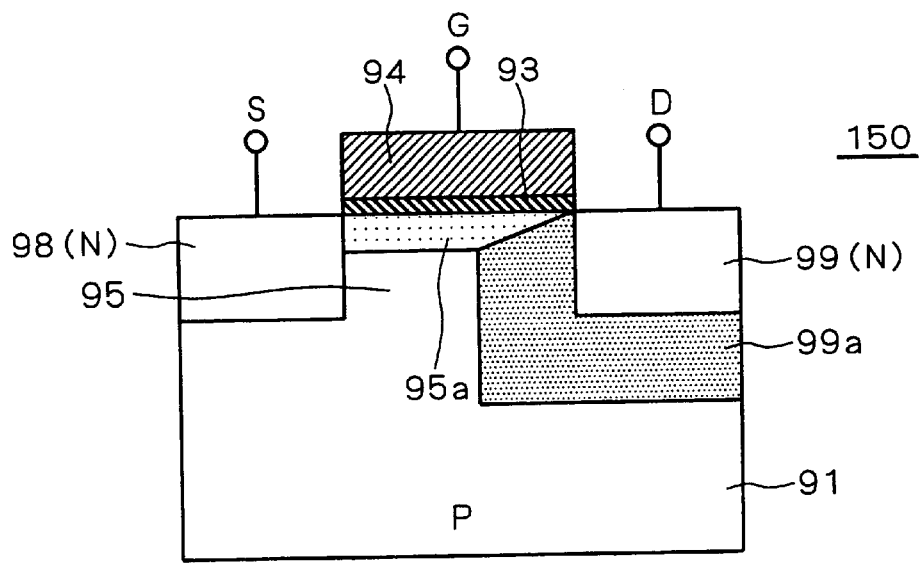

Accordingly, it is directly desirable that the gate upper surface step H should be set within a certain limit. In order to easily reduce the gate upper surface step H in the manufacturing process, moreover, it is more desirable that the upper surface step h should be set within a certain limit. As a result of an experiment, it has been found that the upper surface step h and the thinned portion d have an almost proportional relationship as shown in FIG. 59. In particular, the proportional relationship does not depend on a gate length Lg but is almost constant, if they are normalized to the gate length Lg. The gate length Lg is a width of a portion in the gate electrode 4 which covers the channel region 5.

It is desirable that the thinned portion d should be set to be equal to or smaller than 10% of the gate length Lg such that the operation of the semiconductor device 101 is not practically affected. Therefore, it is preferable that the step h should be reduced to be equal to or smaller than 50% of the gate length Lg as shown in FIG. 59.

The upper surface step h generates the gate upper surface step H. As a result, the thinned portion d is generated. The thinned portion d is directly affected by the gate upper surface step H. Accordingly, it is more directly sufficient that the gate upper surface step H is set to be equal to or smaller than 50% of the gate length Lg in order to set the thinned portion d to be equal to or smaller than 10% of the gate length Lg. A reduction in the upper surface step h to be equal to or smaller than 50% of the gate length Lg is a more desirable method capable of setting the gate upper surface step H to be equal to or smaller than 50% of the gate length Lg without requiring a special process for depositing the material of the gate electrode 4.

The gate upper surface step H and the upper surface step h can be optimized in the same manner for the semiconductor devices according to the other embodiments as well as the semiconductor device 101 according to the first embodiment. Moreover, it is more desirable that the thinned portion d should be smaller. Therefore, it is more desirable that the gate upper surface step H or upper surface step h as a design value should be set to zero and thereby the gate upper surface step H or upper surface step h as an actual value obtained after the completion of the device should be thereby restricted to the range of a manufacturing error.

In order to set the gate upper surface step H within a predetermined limit, it is preferable that the gate upper surface step H should be set within the predetermined limit at the step of forming the gate electrode 4 in the manufacturing method according to each of the embodiments. In order to set the step h within a predetermined limit, moreover, it is preferable that the upper surface step h should be set within the predetermined limit at the step of forming the isolating film 2 in the manufacturing method according to each of the embodiments.

While the invention has been shown and described in detail, the foregoing description is in all aspects illustrative and not restrictive. It is therefore understood that numerous modifications and variations can be devised without departing from the scope of the invention.

What is claimed is:

1. A MOS semiconductor device comprising:
    a semiconductor layer which has a channel region and a pair of source drain regions interposing said channel region therebetween;
    an isolating film formed on a surface of said semiconductor layer to surround said channel region and said pair of source drain regions; and
    a gate electrode formed on side surfaces of said channel region that expose to a trench formed on surface portions of said isolating film adjacent to said channel region by exposing said side surfaces of said channel region and on an upper surface of said channel region with a gate insulating film interposed therebetween, thereby burying said trench and extending on said surface portions of said isolating film.

2. The MOS semiconductor device according to claim 1, wherein a width of said trench is equal to or smaller than a double of a thickness of said gate electrode.

3. The MOS semiconductor device according to claim 1, wherein said trench is formed in such a depth that almost whole side surfaces of said channel region expose, and
    said gate electrode covers said almost whole side surfaces of said channel region with said gate insulating film interposed therebetween.

4. The MOS semiconductor device according to claim 1, wherein a channel width of said channel region is set to be equal to or smaller than a double of a maximum channel depletion layer width.

5. The MOS semiconductor device according to claim 1, wherein said trench comprises first and second trenches and a width of a portion covering said channel region is greater than a width of said channel region adjacent to a bottom portion of said trench.

6. The MOS semiconductor device according to claim 1, wherein said upper surface and said at least a part of said side surfaces in said channel region is covered by said gate electrode with said gate insulating film interposed therebetween, and
    a gate upper surface step defined by a step between an upper surface of a portion covering said channel region and an upper surface of a portion covering said isolating film is set to be equal to or smaller than a half of a gate length defined by a width of said portion covering said channel region.

7. The MOS semiconductor device according to claim 1, wherein said isolating film has a first isolating film and a second isolating film which are formed of materials different from each other,
    said first isolating film is provided between said semiconductor layer and said second isolating film so as to cover a bottom surface and a part of side surface of said second isolating film, and
    said trench is formed on a surface of said first isolating film to expose said first isolating film on its bottom, to expose said channel region on its first side surfaces and to expose said second isolating film on its second side surfaces facing to said first side surfaces.

8. The MOS semiconductor device according to claim 1, wherein said semiconductor layer is divided into a plurality of unit semiconductor layers arranged in a direction of a channel width with a space therebetween, and
    a pair of side surfaces and an upper surface of a channel region of each of said unit semiconductor layers are covered by said gate electrode with said insulating film interposed therebetween.

9. The MOS semiconductor device according to claim 1, wherein said semiconductor layer having a semiconductor substrate, an insulating layer and said SOI layer that are formed one on another in this order.

10. The MOS semiconductor device according to claim 9, wherein a width of said trench is equal to or smaller than a double of a thickness of said gate electrode.

11. The MOS semiconductor device according to claim 9, wherein
    said trench is formed in such a depth that said trench exposes said insulating layer, and
    said gate electrode covers almost whole side surfaces of said channel region with said gate insulating film interposed therebetween.

12. The MOS semiconductor device according to claim 11, wherein said trench is formed to expose at least a part of a bottom surface of said channel region, and
    said gate electrode covers said at least a part of said bottom surface of said channel region with said gate insulating film interposed therebetween.

13. The MOS semiconductor device according to claim 9, wherein a channel width of said channel region is set to be equal to or smaller than a double of a maximum channel depletion layer width.

14. The MOS semiconductor device according to claim 9, wherein said semiconductor layer is divided into a plurality of unit semiconductor layers arranged in a direction of a channel width with a space therebetween, and
    a pair of side surfaces and an upper surface of a channel region of each of said unit semiconductor layers are covered by said gate electrode with said insulating film interposed therebetween.

* * * * *